(12) United States Patent
Haghighat-Kashani et al.

(10) Patent No.: US 9,366,704 B2
(45) Date of Patent: Jun. 14, 2016

(54) METHOD AND SYSTEM FOR FORECASTING POWER REQUIREMENTS USING GRANULAR METRICS

(71) Applicant: Energy Aware Technology Inc., Vancouver (CA)

(72) Inventors: Ali Haghighat-Kashani, Vancouver (CA); Janice Tze-Nee Cheam, Vancouver (CA); Jonathan Mark Hallam, Vancouver (CA); Zhenyu Guo, Vancouver (CA)

(73) Assignee: Neurio Technology Inc., Vancouver (CA)

( * ) Notice: Subject to any disclaimer, the term of this patent is extended or adjusted under 35 U.S.C. 154(b) by 24 days.

(21) Appl. No.: 14/288,630

(22) Filed: May 28, 2014

(65) Prior Publication Data

US 2014/0336960 A1    Nov. 13, 2014

Related U.S. Application Data

(63) Continuation of application No. PCT/CA2012/001097, filed on Nov. 29, 2012.

(60) Provisional application No. 61/564,839, filed on Nov. 29, 2011.

(51) Int. Cl.
*G01R 21/133* (2006.01)
*G06Q 50/06* (2012.01)
(Continued)

(52) U.S. Cl.
CPC ........ *G01R 21/133* (2013.01); *G06F 17/30294* (2013.01); *G06Q 10/04* (2013.01); *G06Q 50/06* (2013.01); *H02J 13/0006* (2013.01); *H02J 13/0062* (2013.01); *H02J 13/0075* (2013.01); *H02J 13/0086* (2013.01); *H02J 2003/003* (2013.01); *Y02B 60/188* (2013.01);
(Continued)

(58) Field of Classification Search
CPC ..................................................... G01R 21/133
USPC ............................................................. 702/60
See application file for complete search history.

(56) References Cited

U.S. PATENT DOCUMENTS

| | | | |
|---|---|---|---|
| 2010/0217550 A1* | 8/2010 | Crabtree et al. | 702/62 |
| 2012/0083930 A1* | 4/2012 | Ilic et al. | 700/287 |
| 2012/0101653 A1 | 4/2012 | Tran | |

FOREIGN PATENT DOCUMENTS

| | | |
|---|---|---|
| WO | 2012038858 | 3/2012 |
| WO | 2012049601 | 4/2012 |

(Continued)

OTHER PUBLICATIONS

Liang et al., "Load Signature Study—Part II: Disaggregation Framework, Stimulation, and Applications", IEEE Transactions on Power Delivery, vol. 25, Issue: 2, pp. 561-569, Apr. 2010.
(Continued)

*Primary Examiner* — Bryan Bui
(74) *Attorney, Agent, or Firm* — John R. Flanagan

(57) ABSTRACT

A method for modeling power usage within a macrogrid uses data relating to the behavioral patterns and states ("BA") of the users, data relating to external impacts on power usage and disaggregated power consumption data in at least one premises within the macrogrid (forming "power usage model data") and thereafter a method of forecasting and predicting future power requirements within the macrogrid uses such power usage model data.

23 Claims, 19 Drawing Sheets

System Block Diagram

(51) Int. Cl.
*G06Q 10/04* (2012.01)
*G06F 17/30* (2006.01)
*H02J 13/00* (2006.01)
*H02J 3/00* (2006.01)

(52) U.S. Cl.
CPC ............. *Y02E 60/74* (2013.01); *Y02E 60/7838* (2013.01); *Y02E 60/7853* (2013.01); *Y04S 10/30* (2013.01); *Y04S 10/54* (2013.01); *Y04S 40/124* (2013.01); *Y04S 40/126* (2013.01)

(56) References Cited

FOREIGN PATENT DOCUMENTS

| WO | 2013001395 | 1/2013 |
|---|---|---|
| WO | 2013011425 | 1/2013 |

OTHER PUBLICATIONS

Broehl, "An End-use Approach to Demand Forecasting", IEEE Transactions on Power Delivery Apparatus and Systems, vol. PAS-100, No. 6, pp. 2714-2718, Jun. 1981.

Patent Cooperation Treaty International Search Report with a mailing date of Apr. 12, 2013 issued for the parent application assigned International Application No. PCT/CA2012/001097 with an International Filing Date of Nov. 29, 2012.

Patent Cooperation Treaty Written Opinion of the International Searching Authority with a mailing date of Apr. 12, 2013 issued for the parent application assigned International Application No. PCT/CA2012/001097 with an International Filing Date of Nov. 29, 2012.

Akhil et al. "Microgrids and the Macrogrid." Presentation to the California Public Utilities Commission, Consortium for Electric Reliability Technology Solutions. 2001.

Kolter et al. "Approximate inference in additive factorial hmms with application to energy disaggregation." International conference on artificial intelligence and statistics. 2012.

Ghahramani, Zoubin, and Michael I. Jordan. "Factorial hidden Markov models." Machine learning 29.2-3 (1997): 245-273.

* cited by examiner

Figure 1 – System Block Diagram

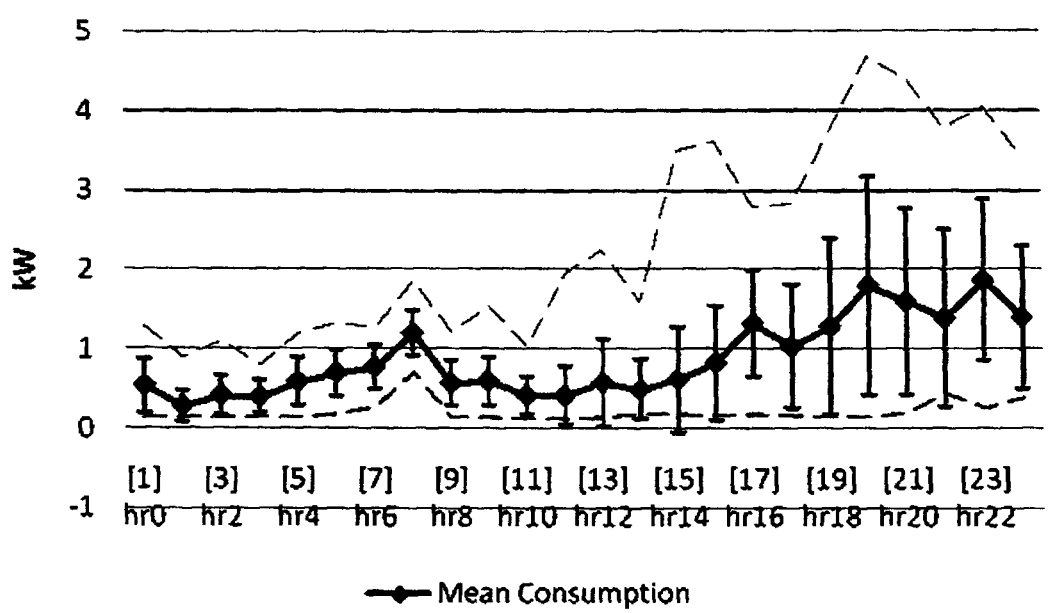
Figure 5.a

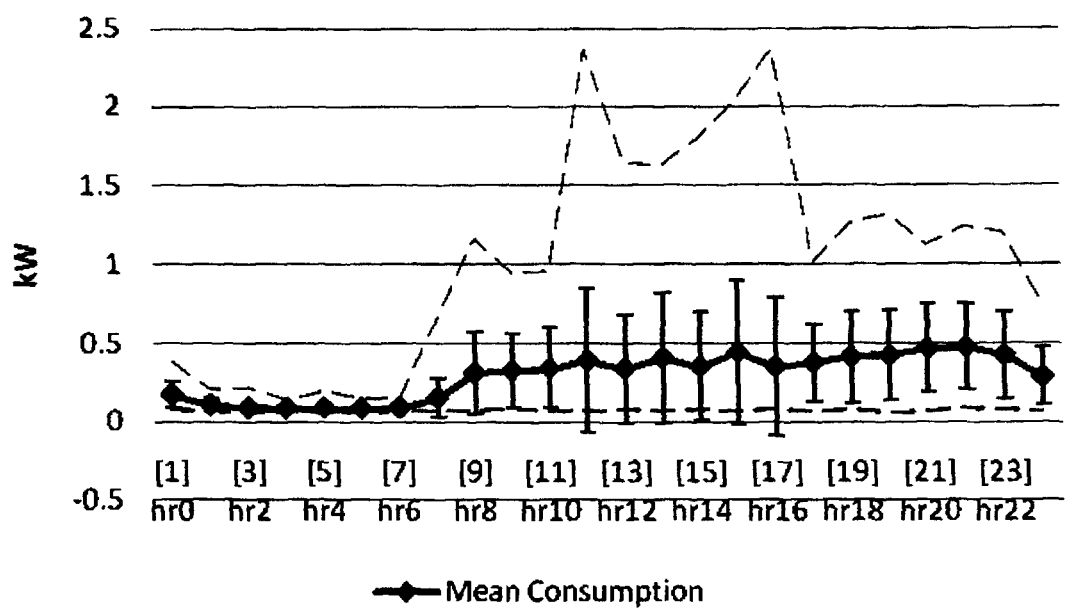
Figure 5.b

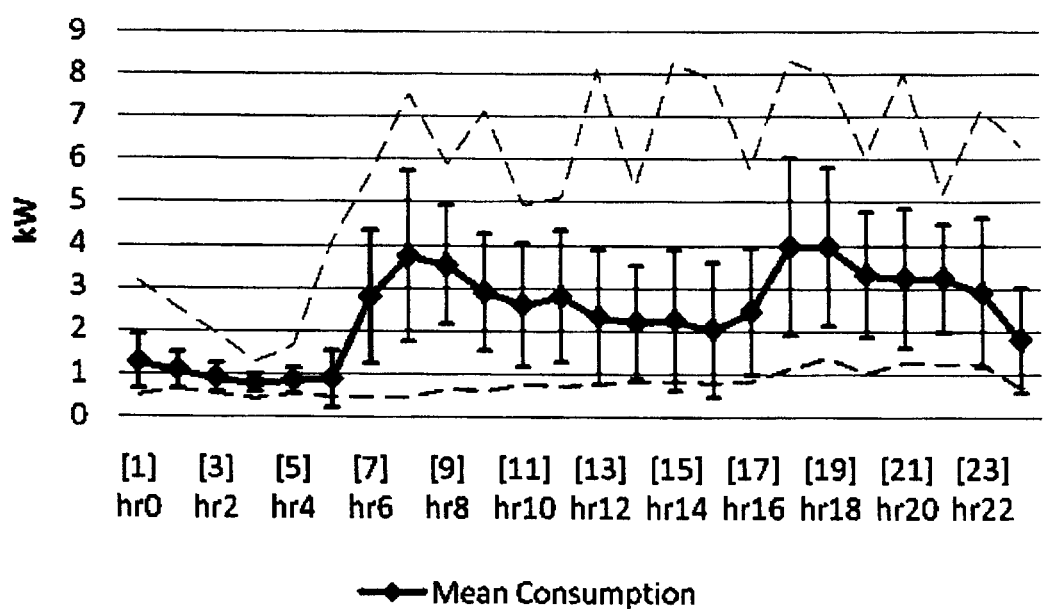
Figure 5.c

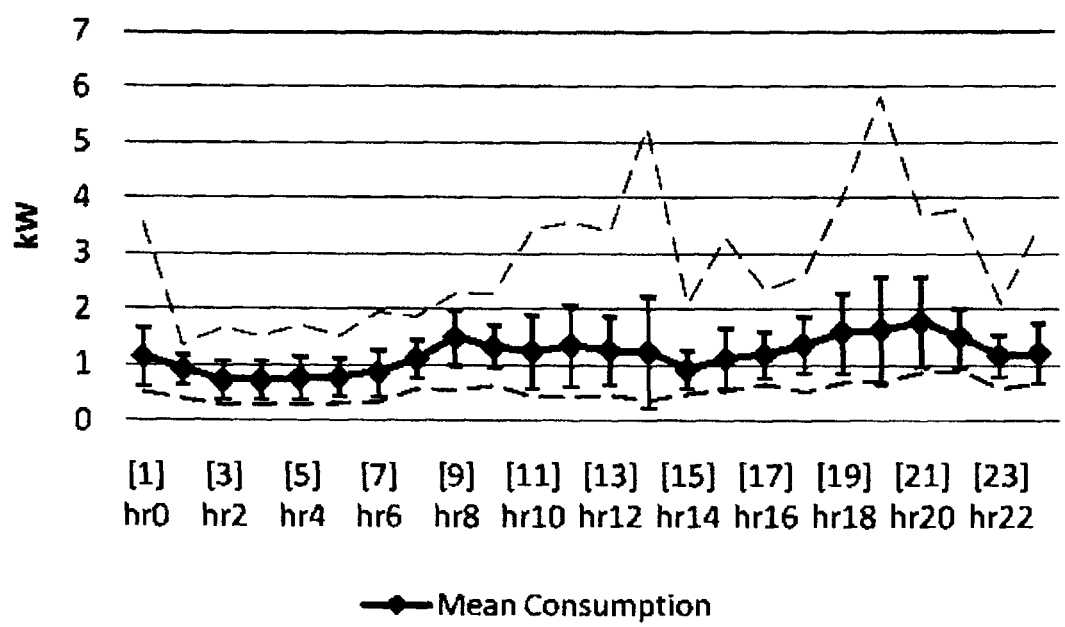
Figure 5.d

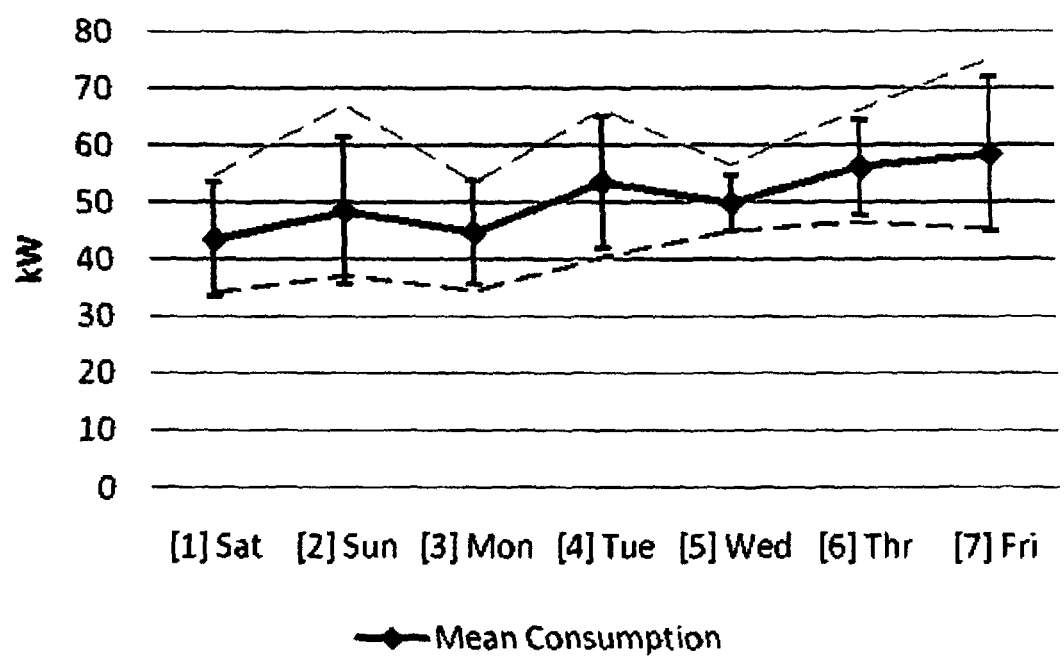
Figure 6.a

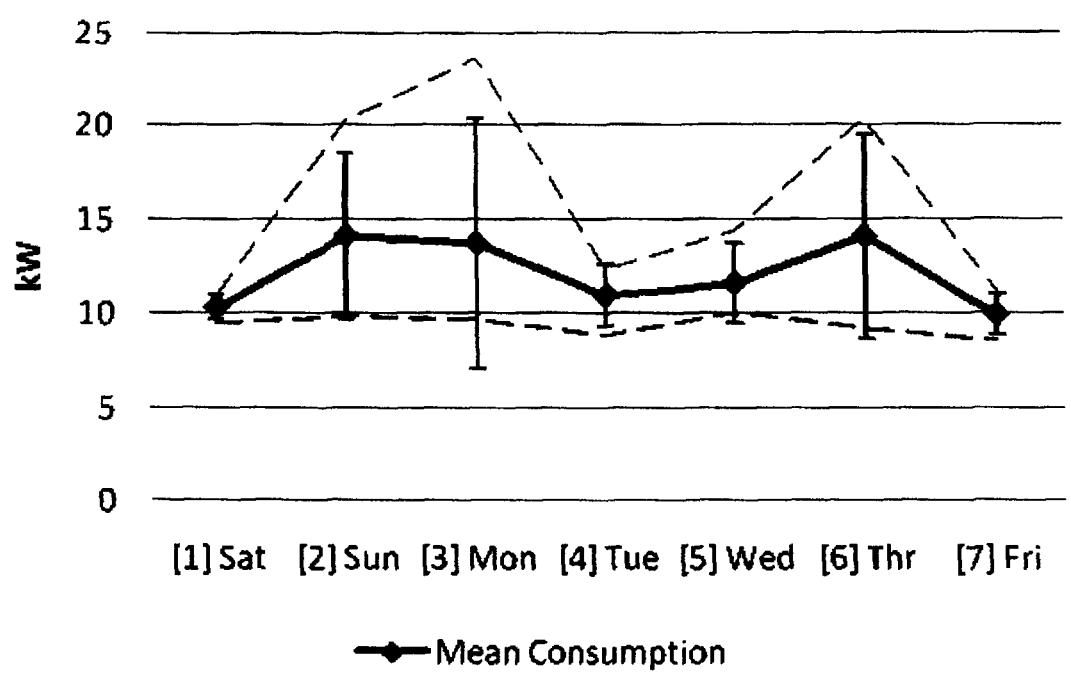
Figure 6.b

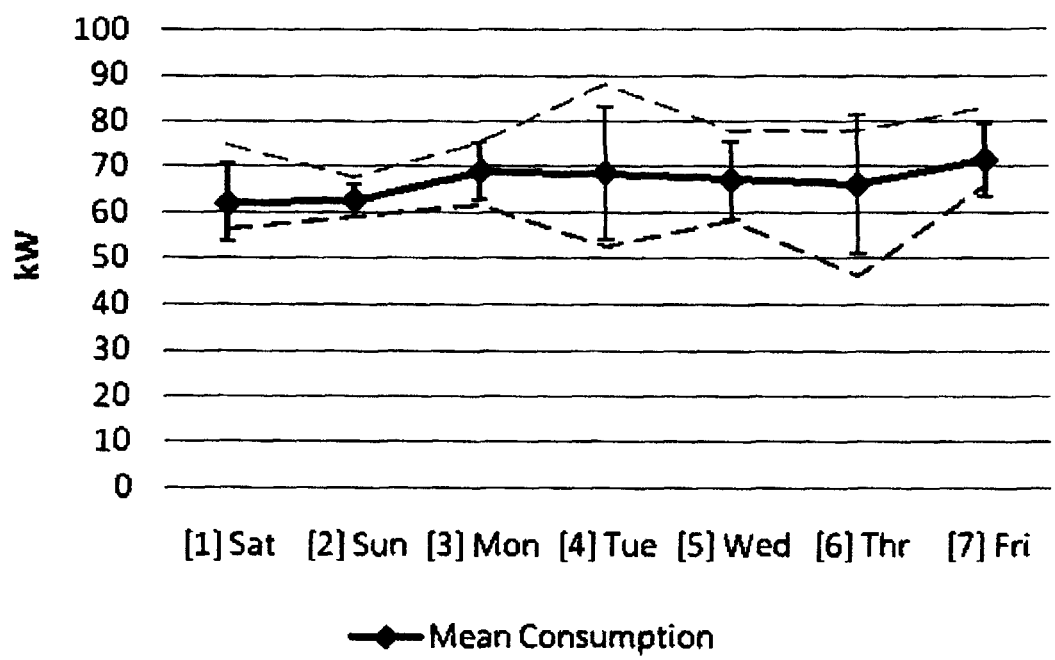
Figure 6.c

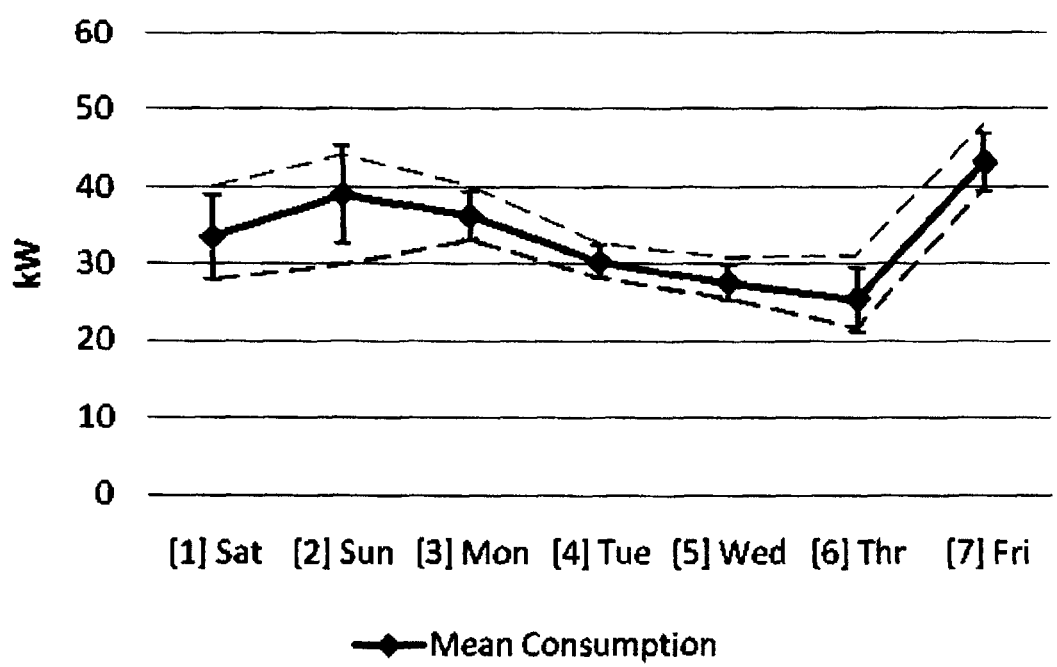
Figure 6.d

METHOD AND SYSTEM FOR FORECASTING POWER REQUIREMENTS USING GRANULAR METRICS

FIELD OF THE INVENTION

The present invention to the field of power monitoring and data analytics in the area of power management.

BACKGROUND OF THE INVENTION

Utility companies are obligated to create demand projections and maintain a regulated reserve margin above it. The capacity that is above or below that margin can be bought or sold in the energy markets.

Furthermore, there is a growing tendency towards unbundling the power system as different sectors of the industry (generation, transmission, and distribution) are faced with increasing demand on planning management and operations of the networks. The operation and planning of a power utility company requires an adequate model for power load forecasting. This load forecasting plays a key role in helping a utility to make important decisions on power, load switching, voltage control, network reconfiguration, and infrastructure development.

Methodologies of load forecasts can be divided into various categories which include short-term forecasts, medium-term forecasts, and long-term forecasts. For example, short-term forecasting gives a forecast of load about one hour ahead of time. Such a forecast may assist in making decisions aimed at preventing an imbalance in the power generation and load demand, which would lead to greater network reliability and power quality.

Many methods have been used for load forecasting. These include statistical methods such as regression and similar-day approach, fuzzy logic, expert systems, support vector machines, econometric models, and end-use models.

New power forecasting models have been introduced such as artificial intelligence (AI), artificial neural network (ANN), and support vector machines (SVM).

An ANN is trained on input data as well as the associated target values. The trained network can then make predictions based on the relationships learned during training. Generally, ANN refers to a class of models inspired by the biological nervous system. The models are composed of many computing elements, usually denoted neurons; each neuron has a number of inputs and one output. It also has a set of nodes called synapses that connect to the inputs, output, or other neurons.

A linear combiner is used to produce a single value from all the inputs. The single value is the weighted sum of the inputs from which the threshold value associated with the neurons is subtracted to compose the activation of the neuron. The activation signal is passed through an activation function to produce the output of the neuron. The chosen activation function is normally a non-linear function (for example, a sigmoid function), a feature that allows the ANN to represent more complex problems.

Most ANN models focus in connection with short-term forecasting use multi-layer perceptron (MLP) networks. The attraction of MLP can be explained by the ability of the network to learn complex relationships between input and output patterns, which would be difficult to model with conventional methods. Inputs to the networks are generally present and past load values. The network is trained using actual load data from the past.

Within the power demand forecasting context, ANN uses data such as total regional demand for energy, weather, daylight hours, and large community events to project the short terms electricity demand of a given region. The mean error for this type of forecast is popularly reported as 1.5%, which may cost a utility millions of dollars in losses annually There are significant other drawbacks to the ANN and like systems. One of the most salient of these is the ongoing requirement to have nothing impacting on the network which would lead to a loss of its generalizing capability.

There are a number of short-term load forecasting algorithms for utility applications and energy trading, such as ANNSTLF by Electric Power Research Institute (EPRI), and NOSTRADAMUS by Ventyx. These use ANN to model the regional load demand, primarily using load history and weather as inputs.

Moreover, there has been research in the area of power prediction and energy optimization using microgrids, or small, localized groups of energy generators/storers. Microgrid is defined as a system as follows:

"—designed, built, and controlled by "customers" based on internal requirements

—subject to the technical, economic, and regulatory opportunities and constraints faced —a cluster of small (e.g. <500 kW) sources, storage systems, and loads which presents itself to the grid as a legitimate entity, i.e. as a good citizen interconnected with the familiar wider power system, or macrogrid, but can island from it.

The Micro Grid concept assumes a cluster of loads, microsources and storage operating as a single system . . . ."[1]

[1] Presented to the grid as a single controllable unit (impacts system reliability Microgrids and the Macrogrid Presentation to the California Public Utilities Commission 20 Feb. 2001 By Abbas Akhil, Chris Marnay, & Bob Lasseter Sandia National Laboratory, Berkeley Lab, and University of Wisconsin, Madison Consortium for Electric Reliability Technology Solutions (available publicly online at www.pserc.wisc.edu/documents/general...by.../certs_cpuc.ppt)

At this microgrid type level, monitoring and assessment of individual users and their loads is undertaken and is feasible. This type of system cannot be reliably or practically used to forecast within a macrogrid.

From the perspective of the consumer, as opposed to utility companies, there are some overlapping but also different concerns in regards to power usage. With the advent of "smart grid" technologies, also called "smart home", "smart meter", or "home area network" (HAN) technologies, optimized demand reductions became possible at the end use or appliance level. Smart grid technologies provided the ability to capture real-time or near-real-time end-use data and enabled two-way communication. Smart grid technologies currently exist for at least some percentage of a utility's customer base and applications are growing throughout North America. From a consumer perspective, smart metering offers a number of potential benefits to householders. These include a) An end to estimated bills, which are a major source of complaints for many customers b) A tool to help consumers better manage their energy use—smart meters with a display can provide up to date information on gas and electricity consumption in the currency of that country and in doing so help people to better manage their energy use and reduce their energy bills and carbon emissions Electricity pricing usually peaks at certain predictable times of the day and the season. In particular, if generation is constrained, prices can rise from other jurisdictions or more costly generation is brought online. It is believed that billing customers by time of day will encourage consumers to adjust their consumption habits to be more responsive to market prices. Regulatory and market design agencies hope these "price signals" will delay the construction of additional generation or at least the purchase of energy from higher priced sources, thereby controlling the steady and rapid increase of electricity prices Using smart grid technologies, a system operator can optimally and dynamically dispatch on and off signaling to specific appliances at a customer location given the observed and forecast loads of other appliances on a circuit or system.

It is an object of the present invention to obviate or mitigate the above disadvantages and to provide solutions for modeling and forecasting in the provision of power resources.

SUMMARY OF THE INVENTION

In one aspect, the present invention provides a method for modeling power usage within a macrogrid, using data relating to the behavioral patterns and states ("BA") of the users, data relating to external impacts on power usage and disaggregated power consumption data in at least one premises within the macrogrid (forming "power usage model data") and thereafter forecasting and predicting future power requirements within the macrogrid, using such power usage model data.

The present invention provides, in one embodiment, a computer implemented method of modeling power usage within a macrogrid, wherein macrogrid is within a region, which comprises:
a) acquiring and storing disaggregated power consumption data in at least one premise, within the macrogrid (load disaggregation, "LD") thereby to determine usage behaviors for appliances and devices by users within the macrogrid ("behavioral patterns");
b) collecting and compiling data relating to the behavioral patterns and states ("BA") of the users;
c) collecting and compiling data relating to external impacts on power usage;
d) using data from one or more of a) to c), in any combination, to create by a processor, an individual consumer forecast ("CF") of power usage, said CF being collectively aggregated across the users;
e) using data from one or more of a) to e), in any combination, to perform and aggregate by a processor a demographic analysis ("DA")'
f) collecting macrogrid aggregate power consumption data for the region;
g) calculating and predicting power consumption requirements across the macrogrid for said region using data from at least one of steps a) to e); and
h) forecasting and predicting future power requirements within the macrogrid, using such data as acquired in at least one of steps a) to g).

The present invention provides, in another aspect, a computer implemented method of modeling power usage within a macrogrid which comprises:
a) receiving and compiling by a processor in real-time granular power consumption data from a statistically significant portion of a target population of power users (the "users") within the macrogrid (the "granular data") for a region;
b) using the granular data and computer processor to perform consumer load disaggregation ("LD") thereby to determine usage behaviors for appliances and devices by said users ("behavioral patterns");
c) collecting and compiling data relating to the behavioral patterns and states ("BA") of the users;
d) collecting and compiling data relating to external impacts on power usage;
e) using data from at least one of steps a) to d), in any combination, to create by a processor, an individual consumer forecast ("CF") of power usage, said CF being collectively aggregated across the users;
f) using data from one or more of a) to e), in any combination, to perform and aggregate by a processor a demographic analysis ("DA")'
g) collecting (macrogrid) aggregate power consumption data for said region;
h) calculating and predicting power consumption requirements across the macrogrid for said region using data from at least one of more of a) to g); and
i) forecasting and predicting future power requirements within the macrogrid, using such data as acquired in at least one of steps a) to h).

The present invention provides, in another aspect, a system for modeling power usage within a macrogrid for the purpose of forecasting and predicting future power requirements within the macrogrid which comprises a server and one or more databases; wherein said server executes, in real time, a method comprising:
a) receiving and compiling disaggregated power consumption data in a premises, within the macrogrid (load disaggregation, "LD") thereby to determine usage behaviors for appliances and devices by users within a macrogrid ("behavioral patterns)
b) collecting and compiling data relating to the behavioral patterns and states ("BA") of the users;
c) collecting and compiling data relating to external impacts on power usage by the users;
d) using data from at least one a) to c), in any combination, to create an individual consumer forecast ("CF") of power usage for one user within all of users within the macrogrid, said CF being collectively aggregated across the users;
e) using data from at least one of a) to d), in any combination, to perform and aggregate a demographic analysis ("DA")'
f) collecting (macrogrid) regional aggregate power consumption data;
g) calculating and predicting power consumption requirements across the macrogrid using data from one or more of a) to f); and
h) forecasting and predicting future power requirements within the macrogrid, using such data as acquired in at least one of steps a) to g).

The present invention provides, in another aspect, a system for forecasting and predicting power usage within a macrogrid which comprises a server and one or more databases; wherein said server executes, in real time, a method comprising:
a) receiving and compiling real time granular power consumption data from a statistically significant portion of a population of power users (the "users") within the macrogrid (the "granular data");
b) using the granular data to perform consumer load disaggregation ("LD") thereby to determine usage behaviors for appliances and devices by said users;
c) collecting and compiling data relating to the behavioral patterns and states ("BA") of the users;
d) collecting and compiling data relating to external impacts on power usage;
e) using data from one or more of a) to d), in any combination, to create an individual consumer forecast ("CF") of power usage, said CF being collectively aggregated across the users;
f) using data from one or more of a) to e), in any combination, to perform and aggregate a demographic analysis ("DA")'
g) collecting (macrogrid) regional aggregate power consumption data; and h) calculating and predicting power consumption requirements across the macrogrid using data from one or more of a) to g)

A further aspect of the present invention comprises a method and system for individualized smart forecasting of power usage. Such a method and system allows a user and/or power supplier to realize and anticipate a consumption forecast for any given utility billing period.

In one aspect, the present invention provides systems and methods for acquiring and storing disaggregated power consumption data in a premise without the requirement of attaching sensors without attaching power sensors onto every single appliance/power draw in the premises.

The method and system of the present invention affords many advantages over the power "information gathering", modeling and forecasting systems previously known. The criticality of the present innovation cannot be under-estimated: power demand has been steadily growing over the last few decades because of the natural expansion in both the residential and industrial sectors. Moreover, it is expected to steeply increase in the near future with the integration of Electric Vehicles (Evs). This growing demand alerts utilities, system operators and consumers regarding possible impacts on the electricity grid in terms of protection, control, cost efficiency and power quality issues if proper actions are not taken to reduce the energy consumption and to ensure efficient monitoring.

In one regard, the load disaggregation collection and analytics of the present invention allow practical use and application of load disaggregation data without the requirement of attaching power sensors onto every single appliance in the premises.

The data analytics in accordance with the present invention yield superior demand forecasts by "segmenting" user profiles and modeling their consumption behavior separately using increased input data granularity. With access to real time segmented data, accurate short term (and long term) demand projections are made more accurately which affords significant cost saving to a utility and ultimately to a consumer, whether that consumer be a family, a business or a manufacturing operation.

DESCRIPTION OF THE FIGURES

The following figures set forth embodiments in which like reference numerals denote like parts. Embodiments are illustrated by way of example and not by way of limitation in the accompanying figures.

FIG. 5.a to 5.d is a series of graphs showing Daily-Hour Patterns;

FIG. 6.a to 6.d is a series of graphs showing Weekly-Day Patterns;

PREFERRED EMBODIMENTS OF THE INVENTION

Figure 1:
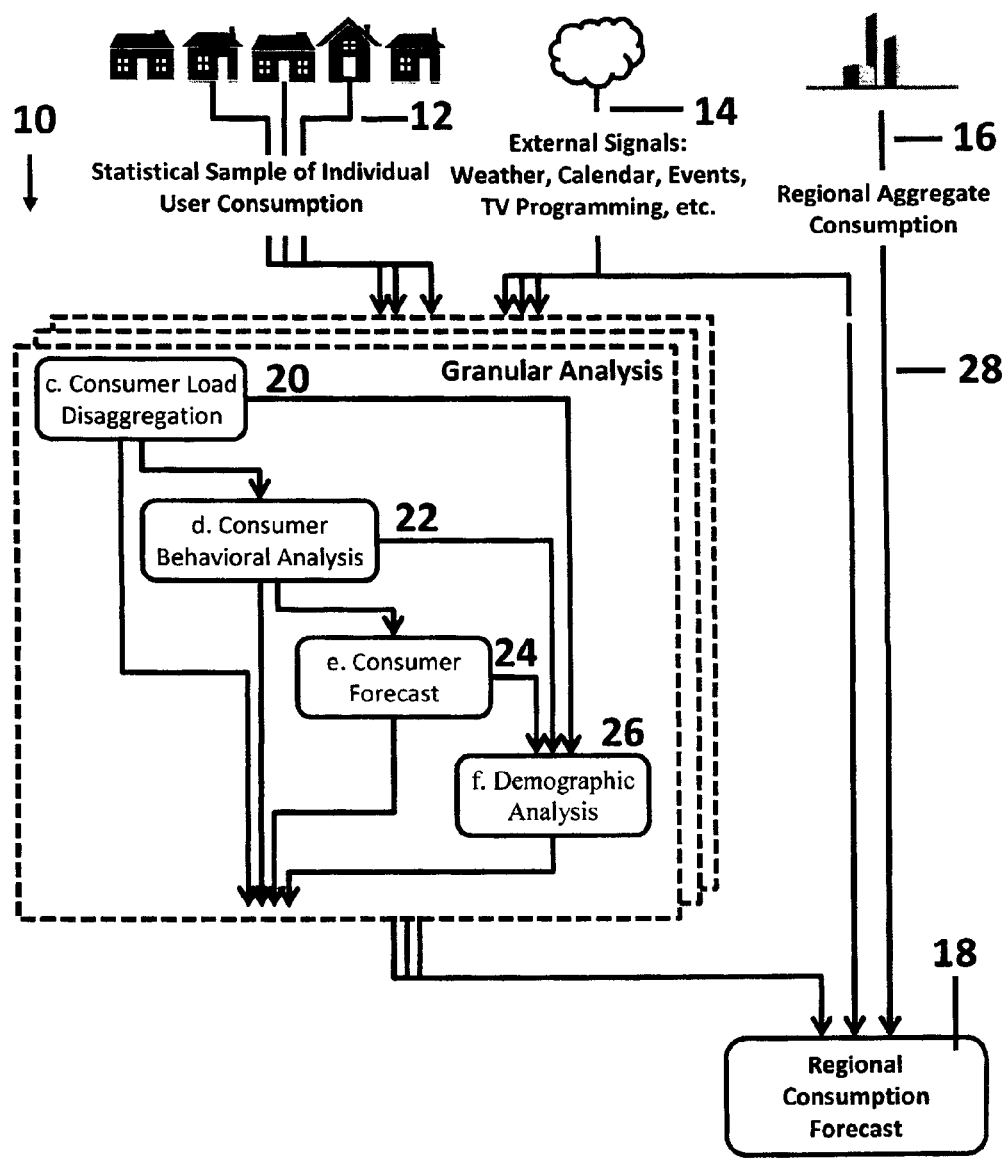
FIG. 1 is a schematic showing the streams and data input and usage in accordance with the present invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Unless specifically stated otherwise, it is appreciated that throughout the description, discussions utilizing terms such as "processing" or "computing" or "calculating" or "determining" or "displaying" or the like, refer to the action and processes of a data processing system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays with the applications described herein are not inherently related to any particular computer or other apparatus. Various general-purpose systems may be used with programs in accordance with the teachings herein, or it may prove convenient to construct more specialized apparatus to perform the required machine-implemented method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

An embodiment of the invention may be implemented as a method or as a machine readable non-transitory storage medium that stores executable instructions that, when executed by a data processing system, causes the system to perform a method. An apparatus, such as a data processing system, can also be an embodiment of the invention. Other features of the present invention will be apparent from the accompanying drawings and from the detailed description which follows.

Terms

The term "invention" and the like mean "the one or more inventions disclosed in this application", unless expressly specified otherwise.

The terms "an aspect", "an embodiment", "embodiment", "embodiments", "the embodiment", "the embodiments", "one or more embodiments", "some embodiments", "certain embodiments", "one embodiment", "another embodiment" and the like mean "one or more (but not all) embodiments of the disclosed invention(s)", unless expressly specified otherwise.

The term "variation" of an invention means an embodiment of the invention, unless expressly specified otherwise.

The term "device" and "mobile device" refer herein interchangeably to any computer, microprocessing device, personal digital assistant, Smartphone other cell phone, tablets and the like.

A reference to "another embodiment" or "another aspect" in describing an embodiment does not imply that the referenced embodiment is mutually exclusive with another embodiment (e.g., an embodiment described before the referenced embodiment), unless expressly specified otherwise.

The terms "including", "comprising" and variations thereof mean "including but not limited to", unless expressly specified otherwise.

The terms "a", "an" and "the" mean "one or more", unless expressly specified otherwise.

The term "plurality" means "two or more", unless expressly specified otherwise.

The term "herein" means "in the present application, including anything which may be incorporated by reference", unless expressly specified otherwise.

The term "whereby" is used herein only to precede a clause or other set of words that express only the intended result, objective or consequence of something that is previously and explicitly recited. Thus, when the term "whereby" is used in a claim, the clause or other words that the term "whereby" modifies do not establish specific further limitations of the claim or otherwise restricts the meaning or scope of the claim.

The term "e.g." and like terms mean "for example", and thus does not limit the term or phrase it explains. For example, in a sentence "the computer sends data (e.g., instructions, a data structure) over the Internet", the term "e.g." explains that "instructions" are an example of "data" that the computer may send over the Internet, and also explains that "a data structure" is an example of "data" that the computer may send over the Internet. However, both "instructions" and "a data structure" are merely examples of "data", and other things besides "instructions" and "a data structure" can be "data".

The term "respective" and like terms mean "taken individually". Thus if two or more things have "respective" characteristics, then each such thing has its own characteristic, and these characteristics can be different from each other but need not be. For example, the phrase "each of two machines has a respective function" means that the first such machine has a function and the second such machine has a function as well. The function of the first machine may or may not be the same as the function of the second machine.

The term "i.e." and like terms mean "that is", and thus limits the term or phrase it explains. For example, in the sentence "the computer sends data (i.e., instructions) over the Internet", the term "i.e." explains that "instructions" are the "data" that the computer sends over the Internet.

Any given numerical range shall include whole and fractions of numbers within the range. For example, the range "1 to 10" shall be interpreted to specifically include whole numbers between 1 and 10 (e.g., 1, 2, 3, 4, . . . 9) and non-whole numbers (e.g. 1.1, 1.2, . . . 1.9).

As used herein, the term "statistically significant portion of a population" refers to a number within any given target population which allows, from the collection of data and/or observance/monitoring of behaviours within said target population, to make inferences about that population from a given sample. In the context of the present invention, depending on the region and population behaviour, this can range from 0.1% to 10% of a given target population. It is to be appreciated that predictability comes from gathering of enough samples to begin to observe predictability in behaviours in the target population, and be able to identify and eliminate noisy from valid patterns. Target population includes a desired subset of the world population, for example, within a province, state, region, city, town, borough, district etc. . . .

As used herein, a "user's "state" with respect to home energy consumption refers to any aspect of such a user's physical character which may impact his/her power usage, for example, whether he/she is: at home, outside, in his/her hometown or away (and for how long), if home whether he/she is asleep or awake, with house guests. . . etc. . . .

As used herein "status" or "state" of an appliance refers to a state of power usage, at a given time. For example, a lamp may have only two states: on and off. A dimmer switch for a light might have a number of states of power draw. An air conditioner may have a number of states of power draw depending on the setting (high, medium, low, for example).

As used herein "duration" or "d" refers to the time an appliance continues or draws in one state before changing or being changed to another state. In an aspect of the method of the invention, d is not fixed knowledge but is estimated as part of the EDHMM-diff.

As used and as described further herein, "behavioural patterns" are used with the method/system of the present invention for forecasting/disaggregation: for example what times a user wakes up or go to bed on weekdays versus weekends, what times user arrives home from work or school, what time user prepares meals, what time and for how long user, watches TV, surfs the internet, does laundry, uses pool and pool pump, uses exercise equipment, uses medical equipment, and how user responds to temperature changes and seasonal weather changes, etc. . . .

As used herein, the term "external impact" refers to one or more signals which are not directly measured from the user by rather from the environment of the user. These include, for example, weather, television schedule (including major events which may be broadcast at any given time), holidays, sunset/sunrise hours, world events etc. . . .

As used herein "premise" refers to any building or structure or environs (interior or exterior) within which there are power draws, for example appliances and equipment. In one aspect, a premise is a residence. In another aspect, a premise is a commercial building or office or factory or institution.

As used herein "appliance" should be interpreted broadly to refer to any drawer of power within a premise, for example, a device, tools, a fixture (including light fixtures), an apparatus, an electrical socket etc. . . .

Load Disaggregation

As used herein, the term "load disaggregation" refers to means of capturing and cataloguing power usage such that it can be ascribed to a particular power draw (for example, an appliance). Without attaching power sensors onto every single appliance in a home, which is expensive and cumbersome, it is challenging to make a correlation between the raw power usage data and total load into individual appliances. Load disaggregation is assessed by the proprietary methods provided herein and therein used to determine the energy consumption of individual appliances by monitoring only the power demand of the total load. One aspect of the present invention is the ability to accurately load disaggregate without the need for multiple appliance sensors.

As used herein, "power draw" refers to both power draw and/or energy consumption.

In another aspect, the LD data acquired thereby is applied to the methods and systems of power modeling and forecasting.

There are a variety of LD methods in the literature which attempt to estimate a breakdown of consuming appliances, in real-time or otherwise. Such algorithms may require superior hardware (e.g., higher sampling rates), sophisticated algorithms, a thorough database of all device pattern signatures, and an adequate computing platform. Alternative methods use specialized hardware, such as "smart plugs," to be installed on each appliance so that each appliance's consumption can be measured separately.

It is to be understood that within the method and system of modeling (to generate forecasts), a number of such LD methods may be used, some employing smart meters and/or appliance specific sensors and others not. As such, the method and system of modeling is not limited to any one mode of acquiring the LD data. Preferably, any such method of acquiring LD data does not require appliance user involvement or interaction. In other words, manual LD techniques are not preferred. Most preferred are such methods which continually monitor a premises power profile feeding such data into the method as described herein.

In essence, one aspect of the present invention provides systems and methods of providing granular consumption information and load disaggregation data to users on "computing platforms" (including, but not limited to, mobile devices such as smartphones, tablets, netbooks and laptops, as well as non-mobile personal computers). The granular consumption information described herein can be generated by for example, smart grid networks, or by custom electric consumption sensors (e.g. current sensors, etc.). There are also numerous ways to communicate the generated data to the end user (including a power provider). For example, this includes the use of the Internet, regional wireless communication methods, cellular networks, home networks such as Wi-Fi, broadband, Zigbee, etc. . . .

Within the scope of this invention, modeling uses "historic information" to create an understanding of how a power using system works, and that understanding is then used to forecast or predict how the power using system will function in future. In creating this model, a given population's consumption behaviors are used to create a granular forecast of future consumption. To model consumption behaviors, one aspect of the present invention provides that LD data (how a user uses power drawing devices) is 1) collected and 2) analyzed.

Factorial Hidden Markov Model (FHMM)

One preferred method of performing LD, and acquiring data therefrom is through FHMM. This method provides means for non-intrusive LD based on power consumption data collected from standard smart meters in premises with a low sampling rate (for example, 1 read per minute, or 1 read per 15 minutes) and wherein LD is determined in an unsupervised way, without the need to measure the "ground truth" to calibrate the system for every premise (for example, within a macrogrid).

In a preferred mode, to cope with the complex scenarios offered in real world applications, the present method uses a "detect-and-tune" step to estimate the FHMM model separately for different potential appliances. In addition, there is provided a quadratic programming (QP) based optimization method for the inference of FHMM, in order to increase the efficiency of the methodology in real-time applications.

A Hidden Markov Model (HMM) is a discrete-time stochastic process including an underlying finite-state Markov Chain (state sequence) and a sequence of random variables whose distributions depend on the state sequence only through the current state (observation sequence). The state sequence is not observable, and hence conclusions about the process must be made using only the observation sequence.

HMMs are among the most successful models for dealing with time series data and the machine learning community has extended this model in many orthogonal directions. The FHMM is an extension of the classical hidden Markov model in which the hidden state is factored[2]. In other words, the information from the past is propagated in a distributed way through a set of parallel Markov chains. This model has been used in vision, audio processing and natural language processing.

[2] Ghahramani, Z., & Jordan, M. I. (1997). Factorial hidden markov models. Machine Learning, 29, 245{273}.

So, HMM have been used to model processes in which some variables are hidden, but are assumed to be statistically related to observed variables. The HMM makes certain assumptions, including that the values of the hidden variables (states) depend only upon previous values of the hidden variables, that the value of each hidden variable is independent of the values of the other hidden variables, and that the values of the observed variables depend only on the current values of the hidden variables. Under these assumptions, a time sequence of values of the hidden variables is inferred from the temporal variation of the observed variable values and knowledge of the parameters of the stochastic process relating the observed variables to the hidden ones.

By definition: an HMM is a collection or random variables consisting of a set of T discrete scalar variables X1:T and a set of T other variables Y1:T which may be either discrete or continuous (and either scalar—or vector-valued). These variables, collectively, possess the conditional independence properties as set out in www.mcgill.ca/files/economics/ntantanispaper.pdf, the contents of which are incorporated herein by reference.

In FHMM, exact inference has a complexity which is exponential in the number of hidden dynamics, and approximate inference techniques are generally required. Existing FHMM implementations generally operate on observed variables that are continuous. For example, the variational inference framework of Ghahramani[2] is limited to continuous (Gaussian) observation variables. The hidden states, on the other hand, are assumed to be discrete, and the number of possible states for a given hidden dynamic is an input parameter to the FHMM analysis.

What has been discovered is that FHMM is a powerful model that is a perfect choice to model the complicated LD challenge. However, the estimation and inference for this FHMM model is NP hard and before the present solution, described in detail herein, no solutions were provided. Although there are several approximating methods for these purposes, they require either annotation of signals by human experts, or very complicated Monte Carlo Markov Chain (MCMC) sampling, which are usually extremely slow. To overcome this challenge within the context of the present invention, there is provided a method of estimating each of the FHMM chains (each representing a power draw within a premise) by using Explicit Duration Markov Model on Difference (EDHMM-diff) of Signals.

Preferably, signal segments (used interchangeably with the term "signal clips") for estimation of the Explicit Duration Markov Model are mined from a testing power signal by a "detect-and-tune" method, wherein a database, store or library of appliance models is used to detect sub-windows which contain signals from a "like" type of appliance within a premise, and thereafter these sub-windows of signals are used to tune the appliance models from the database, store or library to "fit" the appliances in this selected premises. Through this "detect-and-tune" approach, it is possible to successfully estimate all the hidden Markov chains without measuring training data from the premise being tested.

In a further aspect of the present invention, there is provided a database, store or library of appliance models, and the power signal generated by each such appliance. Such a database is created by a) building a sensor network in a plurality of premises (each comprising common appliances); b) monitoring over a selected time all the common appliances to collect get sufficient real data in relation to the power signal generated by each such appliance (power signal data); and c) storing said power signal data.

Premise of LD System

For a premise, the power signal obtained from a smart meter is the summation of the power consumption of all power draws or working appliances in this premise. Assuming the appliances work independently, it is possible to use one HMM to model the behavior of one power draw or appliance. The final observation is the summation of the outputs of these HMMs. The statistical model to describe such system is the FHMM.

Figure 8:
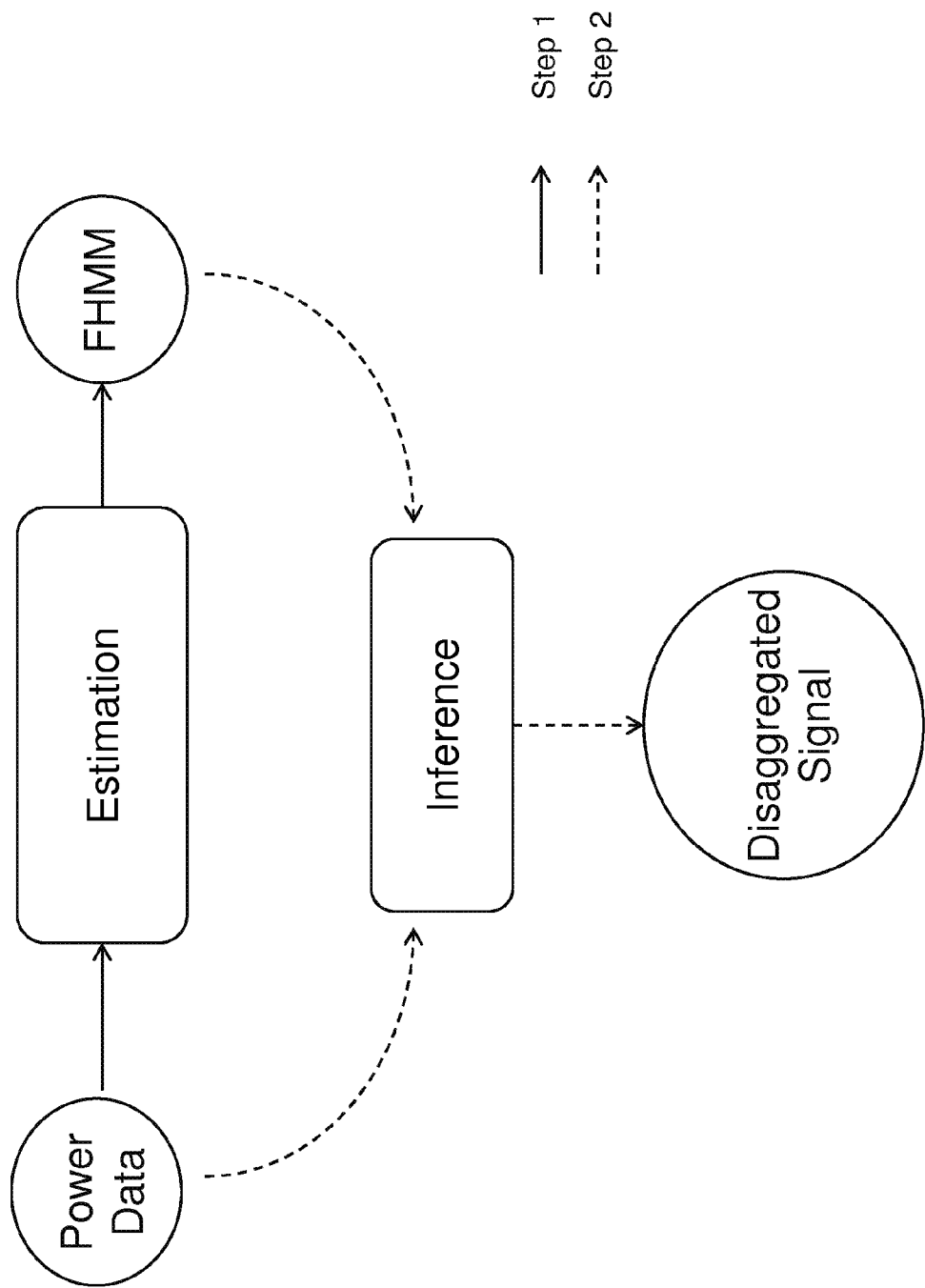
FIG. 8 is a diagram depicting a load disaggregation system based on FHMM.

In a perfect world, one could estimate a FHMM perfectly and then use it to disaggregate power signals into different appliances as depicted in FIG. 8.

EDHMM-diff for Estimation

In reality, however, the estimation (estimating the parameters of FHMM) and inference (disaggregating the final observation into different HMM chains) are not traceable (it is actually NP hard and cannot be solved by any existing computing machine). Researchers have proposed an inexact optimization algorithm to do the inference of FHMM[3], presently applied within the method described herein. As such, the present method provides a means to disaggregate the total power signals provided the correct parameters of the FHMM (wherein such parameters come from estimation). Within the preferred method of the invention, using a "detect-and-tune" step, each of the HMM of the FHMM are estimated independently. Preferably, the model applied within the method of the present invention for estimation purpose is EDHMM-diff, as illustrated in FIG. 9.

[3] Zico Kolter and Tommi Jaakkola. Approximate Inference in Additive Factorial HMMs with Application to Energy Disaggregation. AISTATS, 2012

Figure 9:
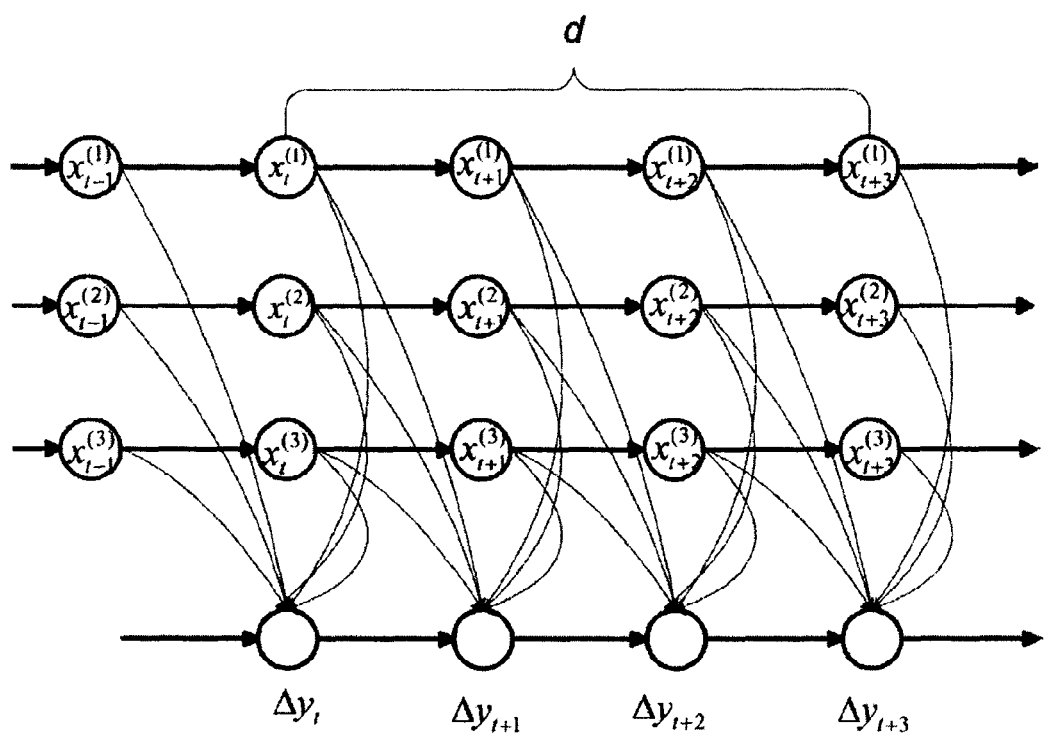
FIG. 9 is an illustration for EDHMM-diff, wherein there are three HMM chains, each used to model one appliance and wherein the final observation is the difference between two adjacent inputs, wherein duration (d) is also modeled.

FIG. 9 shows that each of the independent HMM chains 30, 32 and 34 is each used to model one "putative" appliance (36, 38, and 40) and the final observation is the difference between two adjacent outputs. Assumption is made that the probability for more than two appliances changing states together is very small, and as such, the difference observation (delta y_t) contains the information of status change for at most one of these HMMs. In addition, the method provides that duration d for the status of each HMM is modeled. Together, this model is called Explicit Duration HMM with Difference Observations and is used for LD.

Figure 10:
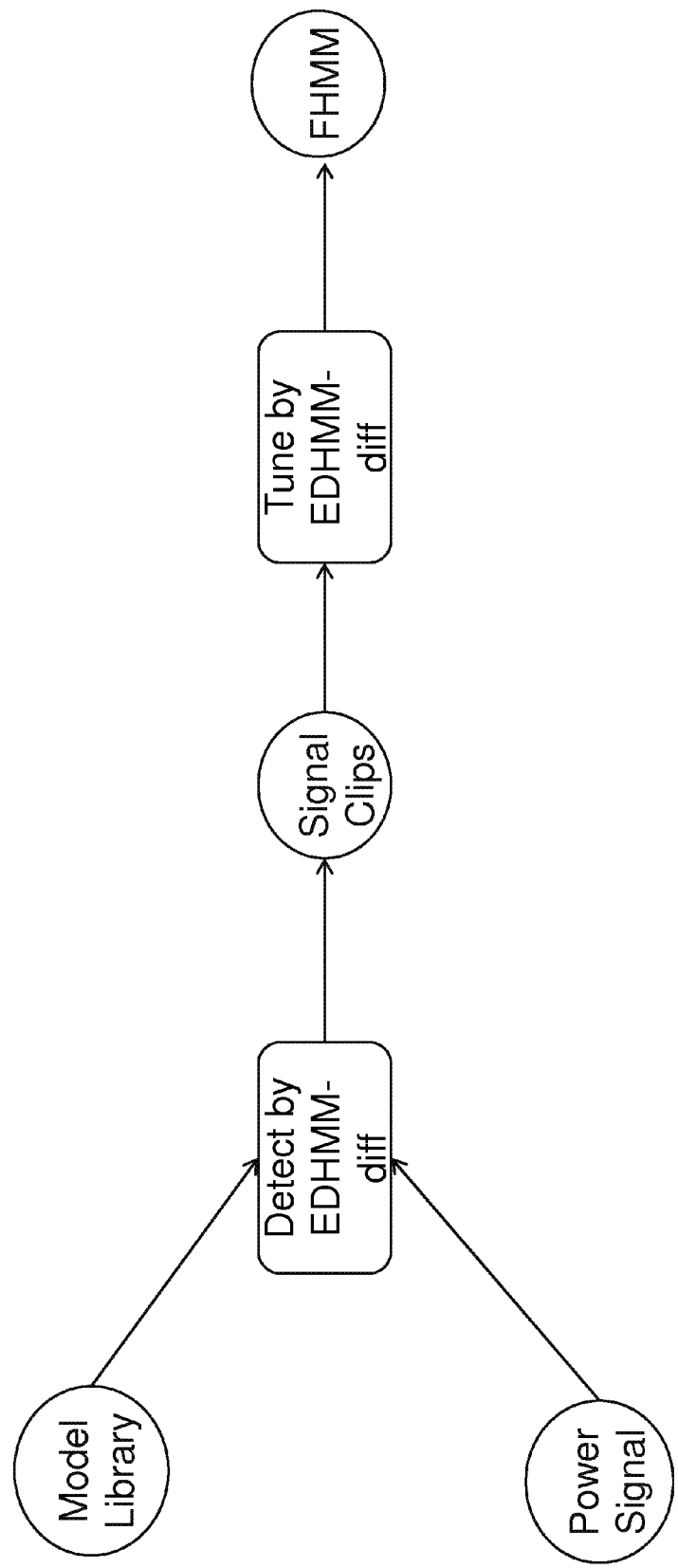
FIG. 10 is a representation of EDHMM-diff for estimation of FHMM, which is a breakdown in detail of the box "Estimation" in FIG. 8.

Within the scope of the invention, to use EDHMM-diff to perform estimation for FHMM, there is created, collected and stored a database or library of models of usual appliances in the premises. This database or library is used as a template (using EDHMM-diff), to detect the signal clips that contain the power signal generated by a given appliance. The signal clips are then used to fine-tune the FHMM parameters using EDHMM-diff. These method steps comprises the "detect-and-tune" steps, as described above and provided in FIG. 10.

Figure 11:
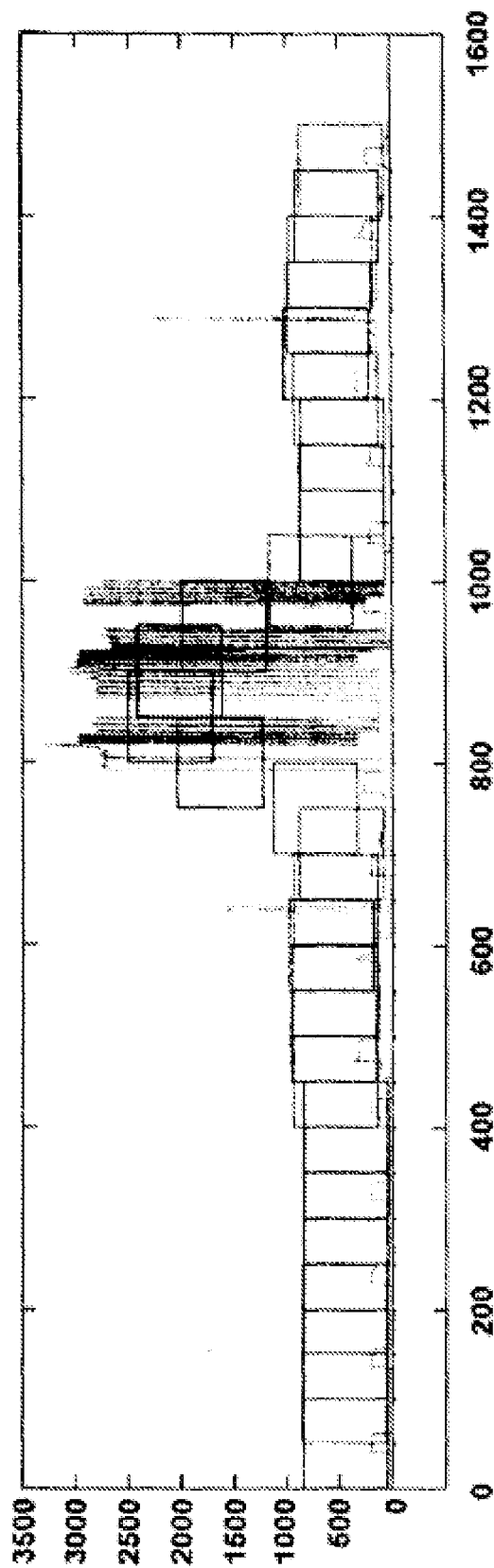
FIG. 11 is a graph illustrating EDHMM-diff detection.

So, within the present invention there is provided the use of an FHMM model for LD purpose and a method for estimating FHMM using, most preferably, an EDHMM-diff. In FIG. 11, the light blue signal is the aggregated power signal obtained from smart meter, and the deep blue windows are the signal clips, which contain power signal generated by cloth dryers, and the red windows are clips that don't contain signals from dryer. This detection is done by EDHMM-diff, and no other previous methods (HMM, explicit duration HMM, etc.) could achieve this goal.

It is to be understood that one or both of energy consumption of an appliance and power draw signals of an appliance may be used for the LD methodology. "Power draw" refers to watts, whereas "energy" refers to watt-hours, and both such signals may be used for LD, as provided herein.

Figure 12:
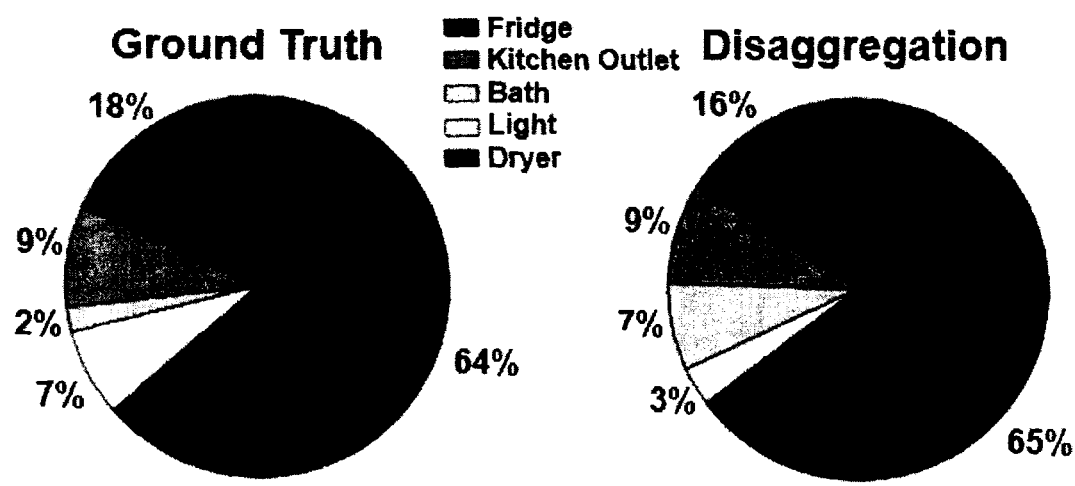
FIG. 12 is a pie chart depicting, at left ground truth and at right disaggregation as calculated by one preferred LD method of the present invention, for proportions of electricity consumption for: fridge, kitchen outlet, bath, light, dryer.
Figure 13:
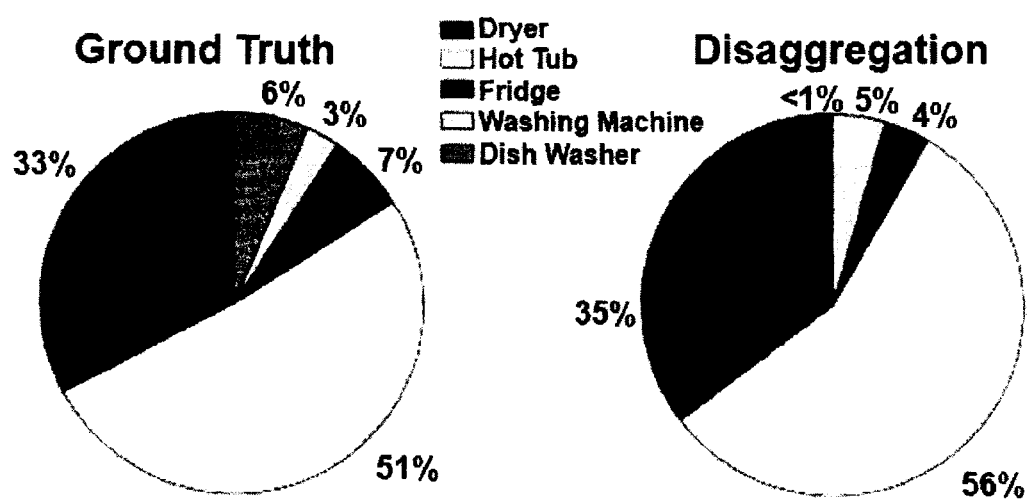
FIG. 13 is a pie chart depicting, at left ground truth and at right disaggregation as calculated by one preferred LD method of the present invention, for proportions of electricity consumption for: dryer, hot tub, fridge, washing machine and dish washer.

FIGS. 12 and 13 are pie charts illustrating the accuracy of the FHMM estimated parameters and illustrate the proportions of electricity consumptions of each device, with the left charts in each figure being the ground truth, and the right charts in each figure representing results achieved by the presently disclosed LD method and system. For example, in FIG. 12, the ground truth is that the kitchen outlet has a 9% proportional power draw. The disaggregation results show the same 9% proportional power draw.

The exemplary embodiment relates to a system and method in which statistical analysis of discrete observations provides useful information about underlying states of the system of interest (appliance power draws). In various aspects, the FHMM is used to model the system over time. The method employs inference and learning algorithms which allow the method to be scaled up, as required.

With all this in mind, the present invention further provides, in another aspect, a method of disaggregating a power load, at a premises, said premises comprising at least two appliances, the method carried out by computer program code stored on non-transient computer-readable medium and executed by a processor, said method comprising at least the following steps:

a) devise a model power draw of a first appliances using HMM (first power draw);
b) devise a model power draw of a second appliance using HMM (second power draw);
c) calculate the difference between the total power draw (first power draw+second power draw) at time t and at time t−1;
d) estimate FHMM using EDHMM-diff, wherein a database comprises power signal clips generated by appliances, including those appliances which are the same as or comparable to the first appliance and the second appliance; and
e) update the parameters of FHMM based on the estimation (at step d) using EDHMM-diff.

Forecasting

Referring now to FIG. 1, the top bar identifies the major components of the forecasting method and system (generally at 10) referred to herein as the Granular Load Projection ("GLP"). Sources of information and data that GLP system collects, compiles and analyzes are identified as:

1. Individual user consumption data, 12: which data contains real time consumption information for a sample number of individual residential, commercial and/or industrial users. The sample size must be statistically significant, given the total population of the region.

2. External Inputs (referred to also as external signals) 14 which are those inputs that affect user consumption or could be used to predict consumption. These include, but are not limited to weather forecasts and patterns (as well as history), TV programming, local events, holidays, etc. . . .

3. Regional Aggregate Consumption 16: which is the total electricity consumption in a given macrogrid region, including historic data, current data, and/or forecast. The data resolution can range, for example, from a fraction of a second to a number of hours or beyond. It is to be clearly understood that the present invention is not limited to any particular time range.

4. Deferring investments: The LD and forecasting analytics described herein may be used for a variety of peak reduction strategies such as designing demand response programs or consumer educational campaigns. Peak reduction results in more available capacity, which could defer investments in infrastructure and extend the life cycle of assets Using the above information, GLP creates a forecast of the total consumption (18) in the macrogrid region over a selected future time period, whether that is hours, days, or months. As used herein in regards to data collection, "real time" is selected from a parameter of within a five minute interval or less or within a one hour interval or less hence providing the benefit of the highly granular data. It is to be clearly understood, however, that real or near-real time may most preferably mean herein a level of approximately 5 minutes or less however other, longer times may also be used in certain situations, such longer times being over hour intervals. In certain embodiments, speed may only be constrained by the speed of processors and/or network connections and communication conduits.

The forecasting and predicting method and system of future power requirements, as provided herein is for the purpose of at least one the following, which comprises an non-exhaustive list:

decreasing and tracking consumer usage of the power resource decreasing consumer costs for power maximizing revenue for the power provider, minimizing consumer discomfort, and identifying future peak usage times and requirements optimizing power distribution: utilities have limited bandwidth to send power from one location to another, so by knowing exactly how much each region is going to require power, they can optimize their distribution planning and make best use of their available bandwidth prioritizing infrastructure upgrades: data can be used to decide which regions require future upgrades in infrastructure (distribution lines, power generation, etc. . . . )

One key aspect of the method and system of the present invention is the means to collect, analyze and manipulate the aforementioned data from information sources 1) to 3) above. GLP creates valuable and usable forecasting data from a statistically significant sample of a user population. To do so, the method within the scope of the present invention comprises:

a) receiving and compiling by a processor in real-time granular power consumption data from a statistically significant portion of a population of power users (the "users") within the macrogrid (the "granular data");

b) using the granular data and computer processor to perform consumer load disaggregation ("LD") thereby to determine usage behaviors for appliances and devices by said users (20);

c) collecting and compiling data relating to the behavioral patterns and states ("BA") of the users (22);

d) collecting and compiling data relating to external impacts (14) on power usage;

e) using data from one or more of a) to d), in any combination, to create by a processor, an individual consumer forecast ("CF") of power usage (24), said CF being collectively aggregated across the users;

f) using data from one or more of a) to e), in any combination, to perform and aggregate by a processor a demographic analysis ("DA"), shown at 26.' g) collecting at 28 (macrogrid) regional aggregate power consumption data; and h) calculating and predicting power consumption requirements across the macrogrid using data from one or more of a) to g)

In one embodiment, external impacts are selected from the group consisting of weather patterns and predictions, calendar month, economic indicators, world events, television programming, equipment age and maintenance, and population mobility. Numerous available external signals (e.g., TV programming) are not often used for load forecasting since regional consumption data alone does not provide enough information to model the response. However, granular data enables load modeling based on such variables since details of user consumptions are made visible, and thus method and system of the present invention is capable of utilizing a wider array of external signals than the conventional forecast methods In one embodiment, BA includes data related to user behavioral states selected from the group consisting of sleeping, identification of when woken, when on vacation, when working from home, charging electric vehicles, and when user might be on an extended absence. In one embodiment, BA includes data related to user behavioral patterns selected from the group consisting of sleeping hours, weekend schedules, weekday schedules, departure to work and arrival home from work, amount of time spent away from home.

By performing LD at a premises level using the granular data, the usage behaviors for major appliances are observed. This improves the load modeling accuracy with respect to a variety of input signals. For instance, the load demand by AC/heaters can be directly observed in response to weather changes.

By observing, collecting and analyzing real-time granular consumption data BA, GLR identifies consumer behaviors that are valuable to forecasting. This includes user's behavioral states (e.g., sleeping, just-woken, away, on-vacation, etc.) or their behavioral patterns (e.g., sleeping hours, weekend vs. weekday schedules, etc.). Such behaviors are often unobservable through external conventionally-available means. The BA results are used to increase forecasting accuracy. More examples of behavioral information and data extracted using BA include:

Whether an Electric Vehicle (EV) is being charged; as well as the EV usage pattern.

The user has just woken up

The user has just arrived home

The user's weekend vs. weekday schedules

Whether the customer is on vacation

Using the real-time granular consumption data, external signals, LD, and BA, the consumption by individual users is forecasted. The individual forecasts from the sample population can then be aggregated and interpolated to form bases of the total load demand projection. While the individual consumer forecast is used for forecasting aggregate regional consumption, it can also be presented to users as a separate product offering. Consumer forecast can help individuals better understand their usage behaviors, and meet their target conservation objectives.

As noted above, using the LD, BA and CF data and analysis, a demographic analysis (DA) can be performed. DA aggregates the details of consumer behaviors observed, to create template models and projections for different demographic categories. It helps identify the best categorization criteria that produce user classes with higher predictability value. DA is particularly important when interpolating the load forecast from a statistical sample of the population to estimate the total regional load demand. Demographic analytics aggregate the details of consumer behaviors obtained using BA and LD, to create template models and projections for different demographic categories.

Demographic analysis takes into account that not all influencing factors will impact all consumers' energy usage the same way. The demographic analysis is particularly important when interpolating the load forecast from a statistical sample of the population to estimate the total regional load demand Using the above information, GLR creates a forecast of the total consumption (18) in the region over a selected future time period, whether that is hours, days, months, quarters, seasons or years. As used herein, "real time" refers to highly granular data collection at within a one hour interval or less, more preferably with a five minute interval or less One aspect of the novelty of the GLR system is in taking advantage of the key pieces of data collection, compilation and analysis based not on users within a microgrid population but on a statistically meaningful sample of individual user's consumption data and then, using a computer processor, extrapolating such data to yield macrogrid level projections. So a forecast for an entire macrogrid can be created based on a statistically significant sample population. Microgrid data cannot be extrapolated in this manner.

Within the scope of the present invention a population sample has a statistical significance if its size is larger than or equal to the smallest possible sample, using which the patterns of the entire population can be observed and modeled within required accuracy. In practice, statistically significance sample sizes could be as small as 0.1%, while 10% sample size or larger could also be used. One skilled in the art may define what confidence level is desired and what margin of error is acceptable. A confidence level of 95% and an error margin of 5% tell you that your result will be within 5% of the true answer 95% of the time you run the survey. So if 100 samples were tested, 95 of them would return a result that was within 5% of the truth.

Generally, a correct sample size is a function of three elements—the sub-universe (i.e. how many people make up the group whose behavior you are trying to represent), your desired error margin, and your preferred confidence level.

Data Acquisition:

New smart meter technology is rapidly being introduced to the industry to facilitate time-of-use metering at residences, permitting utilities to charge for electrical usage dependent upon the time of use and for consumers to take advantage of times at which a lower cost is assessed to the use of electricity.

In one aspect, the data acquiring means of the present invention comprises one or more network managers. Preferably, these one or more network managers which each comprise a modem capable of transmitting measurement data over a network. In one aspect, the system additionally comprises one or more network managers which relay data from the sensor nodes to a server via one or more digital communication channels including but not limited to broadband, DSL, cellular, satellite, WiMAX and Wifi. In particular, it is noted that some Smartmeters communicate over wired channels, and some utilities include internet-based data collection systems to increase their data sampling rate. The present invention incorporates all such data collection means.

In one aspect, the system additionally comprises one or more network managers which aggregate and relay the data from the database storage to a server and wherein said server enables viewing of the data by a viewer via an interface. In one aspect, the system additionally comprises one or more network managers which aggregate and relay the data from a data storage system to a server and wherein said server enables viewing of the data by a viewer via an interface and wherein said interface is selected from the group consisting of a desktop computer, a laptop computer, a hand-held microprocessing device, a tablet, a Smartphone, iPhone®, iPad®, PlayBook® and an Android® device. Those skilled in the relevant art will appreciate that the invention can be practiced with many computer configurations, including hand-held devices, multiprocessor systems, microprocessor-based or programmable consumer electronics, personal computers ("PCs"), network PCs, mini-computers, mainframe computers, and the like. In one aspect, the measurement data is communicated wirelessly on a peer-to-peer network to a central network manager. In one aspect, the measurement data is collected in situ from network managers or sensors including but not limited to current monitoring sensors that are used to estimate power consumption. This can be achieved by workers on site either on the ground or using a bucket truck. In one aspect, the system comprises more than three sensor nodes. In one aspect, the system may be temporarily field deployable on one or more supply line electrical wires and then moved and reset on other supply line electrical wires without the requirement of any wire splicing for such deployment and re-deployment.

A utility's (such as BC Hydro's) Smart Grid network may, in one embodiment, be preferably be used to gather data for use within the method and system of the present invention. In the alternative, other systems may be used to monitor individual power consumption. In a most preferred of such forms, the field deployable node includes one or more components including, but not limited to, a clamp-on current sensor, a micro controller and an RF module. The nodes communicate with each other to self-form into a mesh, star, or tree network topology forming a Field Area Network (FAN). The power usage information from each device is then relayed through said network, and sent to the utility to be compared to other usage data. The system is field deployable requiring no splicing into the electrical wire to allow for quick setup and extraction of the system to allow movement of said system to another location.

Computer Processing

Within the scope of the present invention, data acquisition, compilation, and analysis may preferably be controlled by a computer or microprocessor. As such, the invention can be implemented in numerous ways, including as a process, an apparatus, a system, a computer readable medium such as a computer readable storage medium or a computer network wherein program instructions are sent over optical or communication links. In this specification, these implementations, or any other form that the invention may take, may be referred to as systems or techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

The following discussion provides a brief and general description of a suitable computing environment in which various embodiments of the system may be implemented. In particular, this is germane to the network managers, which aggregate measurement data and downstream to the servers which enables viewing of the data by a user at an interface.

Although not required, embodiments will be described in the general context of computer-executable instructions, such as program applications, modules, objects or macros being executed by a computer. Those skilled in the relevant art will appreciate that the invention can be practiced with other computer configurations, including hand-held devices, multiprocessor systems, microprocessor-based or programmable consumer electronics, personal computers ("PCs"), network PCs, mini-computers, mainframe computers, and the like. The embodiments can be practiced in distributed computing environments where tasks or modules are performed by remote processing devices, which are linked through a communications network. In a distributed computing environment, program modules may be located in both local and remote memory storage devices.

A computer system may be used as a server including one or more processing units, system memories, and system buses that couple various system components including system memory to a processing unit. Computers will at times be referred to in the singular herein, but this is not intended to limit the application to a single computing system since in typical embodiments, there will be more than one computing system or other device involved. Other computer systems may be employed, such as conventional and personal computers, where the size or scale of the system allows. The processing unit may be any logic processing unit, such as one or more central processing units ("CPUs"), digital signal processors ("DSPs"), application-specific integrated circuits ("ASICs"), etc. Unless described otherwise, the construction and operation of the various components are of conventional design. As a result, such components need not be described in further detail herein, as they will be understood by those skilled in the relevant art.

A computer system includes a bus, and can employ any known bus structures or architectures, including a memory bus with memory controller, a peripheral bus, and a local bus. The computer system memory may include read-only memory ("ROM") and random access memory ("RAM"). A basic input/output system ("BIOS"), which can form part of the ROM, contains basic routines that help transfer information between elements within the computing system, such as during startup.

The computer system also includes non-volatile memory. The non-volatile memory may take a variety of forms, for example a hard disk drive for reading from and writing to a hard disk, and an optical disk drive and a magnetic disk drive for reading from and writing to removable optical disks and magnetic disks, respectively. The optical disk can be a CD-ROM, while the magnetic disk can be a magnetic floppy disk or diskette. The hard disk drive, optical disk drive and magnetic disk drive communicate with the processing unit via the system bus. The hard disk drive, optical disk drive and magnetic disk drive may include appropriate interfaces or controllers coupled between such drives and the system bus, as is known by those skilled in the relevant art. The drives, and their associated computer-readable media, provide non-volatile storage of computer readable instructions, data structures, program modules and other data for the computing system. Although a computing system may employ hard disks, optical disks and/or magnetic disks, those skilled in the relevant art will appreciate that other types of non-volatile computer-readable media that can store data accessible by a computer system may be employed, such a magnetic cassettes, flash memory cards, digital video disks ("DVD"), Bernoulli cartridges, RAMs, ROMs, smart cards, etc.

Various program modules or application programs and/or data can be stored in the computer memory. For example, the system memory may store an operating system, end user application interfaces, server applications, and one or more application program interfaces ("APIs").

The computer system memory also includes one or more networking applications, for example a Web server application and/or Web client or browser application for permitting the computer to exchange data with sources via the Internet, corporate Intranets, or other networks as described below, as well as with other server applications on server computers such as those further discussed below. The networking application in the preferred embodiment is markup language based, such as hypertext markup language ("HTML"), extensible markup language ("XML") or wireless markup language ("WML"), and operates with markup languages that use syntactically delimited characters added to the data of a document to represent the structure of the document. A number of Web server applications and Web client or browser applications are commercially available, such those available from Mozilla and Microsoft.

The operating system and various applications/modules and/or data can be stored on the hard disk of the hard disk drive, the optical disk of the optical disk drive and/or the magnetic disk of the magnetic disk drive.

A computer system can operate in a networked environment using logical connections to one or more client computers and/or one or more database systems, such as one or more remote computers or networks. A computer may be logically connected to one or more client computers and/or database systems under any known method of permitting computers to communicate, for example through a network such as a local area network ("LAN") and/or a wide area network ("WAN") including, for example, the Internet. Such networking environments are well known including wired and wireless enterprise-wide computer networks, intranets, extranets, and the Internet. Other embodiments include other types of communication networks such as telecommunications networks, cellular networks, paging networks, and other mobile networks. The information sent or received via the communications channel may, or may not be encrypted. When used in a LAN networking environment, a computer is connected to the LAN through an adapter or network interface card (communicatively linked to the system bus). When used in a WAN networking environment, a computer may include an interface and modem or other device, such as a network interface card, for establishing communications over the WAN/Internet.

In a networked environment, program modules, application programs, or data, or portions thereof, can be stored in a computer for provision to the networked computers. In one embodiment, the computer is communicatively linked through a network with TCP/IP middle layer network protocols; however, other similar network protocol layers are used in other embodiments, such as user datagram protocol ("UDP"). Those skilled in the relevant art will readily recognize that these network connections are only some examples of establishing communications links between computers, and other links may be used, including wireless links.

While in most instances a computer will operate automatically, where an end user application interface is provided, a user can enter commands and information into the computer through a user application interface including input devices, such as a keyboard, and a pointing device, such as a mouse. Other input devices can include a microphone, joystick, scanner, etc. These and other input devices are connected to the processing unit through the user application interface, such as a serial port interface that couples to the system bus, although other interfaces, such as a parallel port, a game port, or a wireless interface, or a universal serial bus ("USB") can be used. A monitor or other display device is coupled to the bus via a video interface, such as a video adapter (not shown). The computer can include other output devices, such as speakers, printers, etc In a preferred form, it is envisioned that data relating to the present disclosure can be transmitted over such networks or connections. The computer system can be adapted to communicate with a user/participant and/or a device used by a user/participant. The computer system is adaptable to communicate with other computers over the Internet, or with computers via a server. Each computing device (including mobile devices) includes an operating system (OS), which is software, that consists of software programs and data that runs on the devices, manages the device hardware resources, and provides common services for execution of various application software. The operating system enables an application program to run on the device.

In such way, as will be appreciated by those skilled in the art, a computer readable medium stores computer data, which data can include computer program code that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

The method of the present invention, for example, the analytics (including the signal clip detection) may occur on: a computer or a set of computers at the utility site, at a third party company location, one or more servers in a cloud, or even on-site at the premise (for example household) where the data is collected. In respect to the latter, the algorithm required to implement the method may be placed on a Network Interface Card (NIC) on a smart meter at the premise. NICs are responsible for communicating smart meter measurements to the outside world i.e. outside the premise, but they also have other processing capabilities on-board. So, in one aspect of the present invention, rather than conveying raw power data away from the premise, for application to the method and processing of the invention "off site", in one preferred aspect, all such processing is implemented by embedded programs on a NIC card at a premise.

In regards to another aspect of the invention, wherein analytics are implemented on an internet server, a method is provided as follows: every time a power/energy reading is measured by a sensor, the data is communicated to the server, which hosts a database. The database stores a copy of the data. Either immediately, or at a future time interval, when the results of LD/analytics are needed (this could be frequent 'interval' runs of the analytics, or just on-demand runs whenever a user wants to see their breakdown), the data is then passed into the analytics processing engine, which is also in a server (for example, this may be on the same server as the database, or a different server; as long as they are both online, enabling communication therebetween. The new readings along with a window of historic measurements are then fed to the analytics engine to perform operations such as forecasting, FHMM LD, etc. . . . all in accordance with the methods described herein.

Although it is described herein that a server may be a cloud server (one or a set of server computers hosted off-site), it is worth noting that some jurisdictions may have regulations that limit the data leaving a region/country etc. . . . , for example, user consumption data collected in Australia may not leave Australia. As a solution, one may utilize a cloud server provider, such as Amazon, that has an Australian server base, or one may set up our private servers in that country or even inside the utility premises.

In a preferred aspect, the signals are detected on the same computer processor/machine that performs the remainder of the analytics.

Some aspects of the present invention may be delivered via mobile application. In this way, a user launches an app created by an app creator and downloaded to the user's mobile device to view digital content items and can connect to a front end server via a network, which is typically the Internet, but can also be any network, including but not limited to any combination of a LAN, a MAN, a WAN, a mobile, wired or wireless network, a private network, or a virtual private network. As will be understood a very large numbers (e.g., millions) of users are supported and can be in communication with the website via an app at any time. The user may include a variety of different computing devices Application delivery platform can be implemented entirely in hardware and/or a combination of hardware and/or software in execution. Further, application delivery platform can be incorporated within and/or associated with other compatible components. Additionally, application delivery platform can be, but is not limited to, any type of machine that includes a processor and/or is capable of effective communication with network topology and/or cloud. Illustrative machines that can comprise application delivery platform can include desktop computers, server class computing devices, laptop computers, notebook computers, Tablet PCs, consumer and/or industrial devices and/or appliances, hand-held devices, and the like.

Network topology and/or cloud can include any viable communication and/or broadcast technology, for example, wired and/or wireless modalities and/or technologies can be utilized to effectuate the claimed subject matter. Moreover, network topology and/or cloud 104 can include utilization of Personal Area Networks (PANs), Local Area Networks (LANs), Campus Area Networks (CANs), Metropolitan Area Networks (MANs), extranets, intranets, the Internet, Wide Area Networks (WANs)—both centralized and/or distributed—and/or any combination, permutation, and/or aggregation thereof. Furthermore, as those skilled in the art will appreciate and understand various data communications protocols (e.g., TCP/IP, Ethernet, Asynchronous Transfer Mode (ATM), Fiber Distributed Data Interface (FDDI), Fibre Channel, Fast Ethernet, Gigabit Ethernet, Wi-Fi, Token Ring, Frame Relay, etc.) can be utilized to implement suitable data communications.

Additionally application delivery server/platform may include a provisioning component that, based at least in part on input received from a portal component, can automatically configure and/or provision the various disparate mobile devices with appropriate applications.

The foregoing detailed description has set forth various embodiments of the devices and/or processes via the use of examples. Insofar as such examples contain one or more functions and/or operations, it will be understood by those skilled in the art that each function and/or operation within such examples can be implemented, individually and/or collectively, by a wide range of hardware, software, firmware, or virtually any combination thereof. In one embodiment, the present subject matter may be implemented via ASICs. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, flash drives and computer memory; and transmission type media such as digital and analog communication links using TDM or IP based communication links (e.g., packet links).

Individual Consumer Forecasts (CF)

The present invention is not solely about the creation of regional consumption forecasts. Using the data collection and analyses herein defined, and as prescribed in the methods and systems of this aspect of the invention, individualized smart budgeting can also be achieved. So, the present invention further comprises a budgeting method and system which allows each user to specify a target budget for their billing period. The analysis provides users with real-time feedback as to whether their consumption habits are likely to meet their desired budget.

The simplest way to approach budgeting is to divide the total budget by the number of hours in the billing cycle, and inform the user when their hourly consumption goes beyond the pre-defined hourly budget. However, this method would not provide users with much beneficial feedback because the users require different amounts of electricity at different hours and days. For instance, if the amount of allocated budget for 5 PM is the same as 5 AM, the user will always appear to be over-consuming (i.e., consumption>budget) at 5 PM, and under-consuming (i.e., consumption<budget) at 5 AM.

The Smart Budgeting (SB) method and system as described herein, on the other hand, provides users with a more intelligent and practical feedback. At each hour, the allocated budget is determined using the following variables:

a) How much of the budget is left to be consumed (subtract the money spent so far in the billing period, from the total budget).
b) The forecasted consumption for this day and hour.
c) The total forecasted consumption in the remaining portion of the billing cycle.
d) The observed deviation in user's consumption for the current day and hour.

The Smart Budgeting system and method of the present invention is capable of taking into account the fact that hours with higher consumption amount and higher consumption deviation represent better opportunities for users to conserve energy.

In operation, Smart Budgeting in accordance with the present invention may be illustrated (by way of example) as follows:

The given data for analysis:
The closing date of the billing cycle
Hourly readings of user's consumption over the previous months Performance Evaluation Running the algorithm over user's previous months of consumption, the algorithm performance can be measured by comparing the forecast value to the actual billing cost of the corresponding period.

$$B_R = \sum_{i \in P} C_i,$$

$$B_F = \sum_{i \in P} F_i$$

$$e_P = |B_F - B_R| = \left|\sum_{i \in P}(F_i - C_i)\right|$$

where C is the hourly consumption, F is the hourly forecast, $B_R$ is the real billing cost, $B_F$ is the forecasted bill, P is the billing period, and $E_P$ is the forecast error of the given period.

Choosing different billing cycle closing dates would result in different error values. Herein provided is a performance evaluation method in which the outcome depends only on the forecast algorithm itself, and not the billing period. Hence, the present method uses the above method over all possible billing periods (i.e. starting at every single day in the entire data):

$$PI = \sum_{\forall P \subseteq \{C\}} e_P$$

where PI is the Performance Index. The lower the PI, the more accurate the forecast algorithm.

The PI can be calculated for all available load profiles. Whether designing, improving or comparing forecast algorithms, the ultimate intention is to minimize PI which in turns leads to more accurate forecast bills.

PI can be obtained for different billing cycle lengths (e.g. a week long, a month long, or a two month billing cycle). In general, it has been observed that as the billing cycle grows the PI increases exponentially.

It is worth noting that the forecast made at the beginning of a two-month billing period is basically the worst case scenario and it is likely to create the most inaccurate result. As the time moves forward, the length of the period over which we forecast shrinks, and the length of the time for which actual readings are used grows. Consequently, by the end of the billing period, the value presented as "forecast bill" consists mostly of actual readings rather than forecast values. Therefore, the accuracy increases as the time passes.

Principles

Based on the examined household load profiles, it can be shown that there are very little common behavioral features among different electricity users. However, a single user does demonstrate behavioral patterns over the course of time. The objective of the forecast algorithm, as applied within the system and method of the invention, is to utilize a pattern recognition system to exploit this fact. Hence, an unsupervised learning approach is suggested based on statistical analysis.

Figure 2:
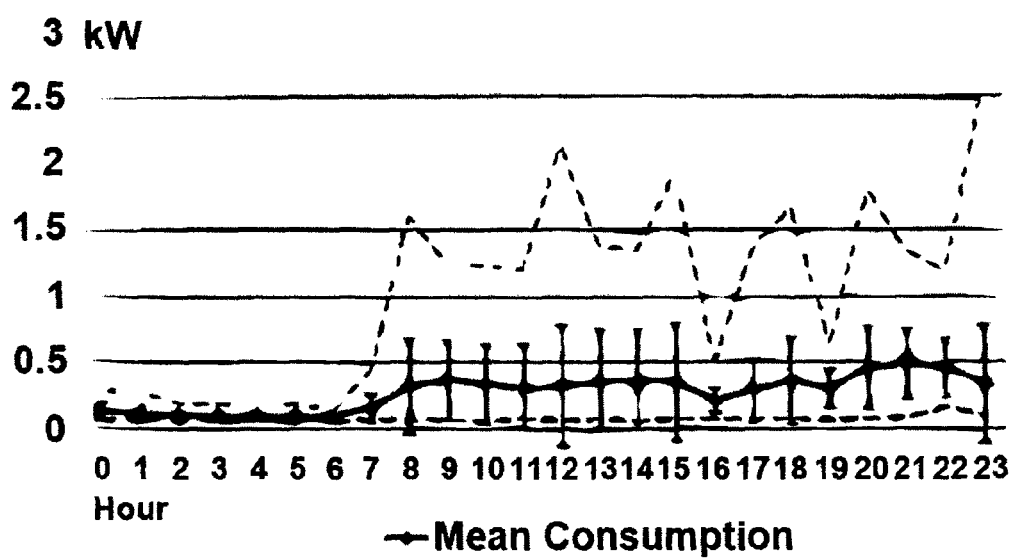
FIG. 2 is a graph showing the Mean and Standard Deviation over Period Length of One Day and Time-Resolution of One Hour.
Figure 3:
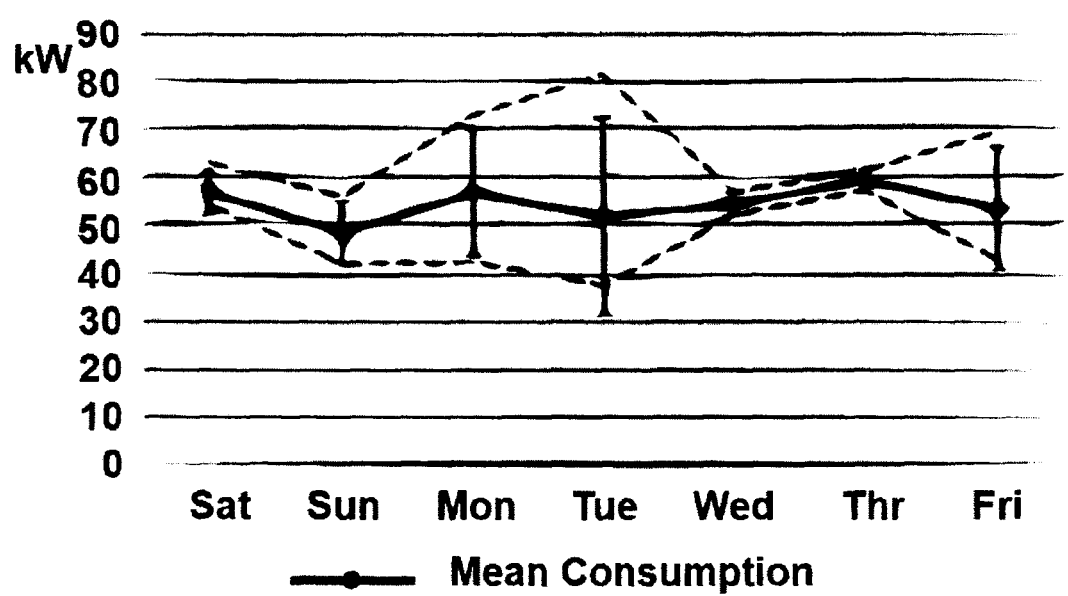
FIG. 3 is a graph showing Mean and Standard Deviation over Period Length of One Week and Time-Resolution of One Day.

Patterns can be found in different frequencies and time-resolutions. For instance, a pattern can be found in hours of every day—time-resolution of an hour, period length of a day (FIG. 2); another example is detecting a pattern in days of a week—time-resolution of a day, period length of a week (FIG. 3).

While multiple patterns can exist simultaneously, the combination of patterns varies for different households. For instance, while one user may demonstrate a very strong hourly behavior every day, another user may not demonstrate a clear hourly pattern at all. Nevertheless, the same two users might have strong weekly-day patterns. Consequently, the present invention provides a method and system which can analyze all possible patterns and extract and only the appropriate ones for each user.

To make the matter more complicated, on a single frequency, a user might demonstrate a behavioral pattern in parts of the period length, and no behavior at all in the remaining. For instance, most users have a very strong behavior over sleeping hours (highly repeating, low deviation), but no clear behavior during the daytime (non-repeating, high deviation). FIG. 2 demonstrates this fact as the deviation in early hours of a day is rather minimal, while the deviation of the later hours of the day varies significantly. Therefore, the forecast algorithm should be able to integrate the detected patterns in the highest time-resolution (smallest values for $\beta$ defined below), and for each time unit in the future use their strongest patterns to make a forecast. To demonstrate this in FIG. 2 and FIG. 3, the forecast value for 5 AM Tuesday should be entirely based on the pattern in FIG. 2; the forecast value for 3 PM Thursday should be mostly based on the pattern in FIG. 3; and the forecast value for 1 AM Wednesday should take advantages of the both patterns.

Pattern Analysis

As noted above, patterns exist in different frequency and time-resolutions. The consumption data, provided in a resolution, is presented by $C^\alpha$:

$$C^\alpha = \{C_1^\alpha, C_2^\alpha, C_3^\alpha, \ldots, C_N^\alpha\}$$

The first step, then, is to take this data to the correct time-resolution for the pattern of interest, $\beta$:

$$\text{new size } N' = \frac{N}{\beta},$$

$$C^\beta = \{C_1^\beta, C_2^\beta, \ldots, C_{N'}^\beta\}$$

$$C^\beta = \left\{ \sum_{i=1}^{\frac{\beta}{\alpha}} C_i^\alpha, \sum_{i=\frac{\beta}{\alpha}+1}^{2\cdot\frac{\beta}{\alpha}} C_i^\alpha, \ldots, \sum_{i=(N'-1)\frac{\beta}{\alpha}+1}^{N'\cdot\frac{\beta}{\alpha}} C_i^\alpha \right\} \to k = [1, N']$$

$$C_k^\beta = \sum_{i=(k-1)\cdot\frac{\beta}{\alpha}+1}^{k\cdot\frac{\beta}{\alpha}} C_i^\alpha$$

Note that $\beta \geq \alpha$, since the desired pattern resolution is never smaller than the original data's resolution. Next, the mean ($\mu$) is calculated and the deviation (s) of each $\beta$-sized time interval (t), within the period length P.

$$\text{for } t = \left[1, \frac{P \cdot \alpha}{\beta}\right] \text{ and } d = \left\lfloor \frac{N'}{\frac{P \cdot \alpha}{\beta}} \right\rfloor = \left\lfloor \frac{N}{P \cdot \alpha} \right\rfloor,$$

$$\mu_t = \frac{1}{d} \sum_{i=0}^{d-1} C_{(i \cdot d + t)}^\beta,$$

$$s_t = \sqrt{\frac{1}{d-1} \sum_{i=0}^{d-1} \left(C_{(i \cdot d + t)}^\beta - \mu_t\right)^2}$$

A more algorithmic way of representing $\mu$ and s is:

$$\left\{ \forall i: i \% \frac{P \cdot \alpha}{\beta} = t \mid \mu_t = \frac{1}{d} \sum_i C_i^\beta, s_t = \sqrt{\frac{1}{d-1} \sum_i \left(C_i^\beta - \mu_t\right)^2} \right\}$$

A forecast of the future consumption can be made based on the mean and standard deviation. While a low standard deviation ($s_t$) indicates a highly repetitive behavior in the given time resolution and offset, a high deviation indicates no significance pattern.

Once the standard deviation is acceptable at the given time-interval t of $$\frac{1}{P}$$

frequency, the mean value ($\mu_t$) can be used as the prediction of the users future behavior at the same time-interval of future periods.

Pattern Analysis Example

The following section demonstrates an example of the above steps. Using an hourly data provided for a period of a month (N=720 hours), the behavioral pattern over days of a week are investigated (resolution: 1 day or 24 hours, period length P=1 week or 168 hours).

Table 1 shows a portion of the raw data [ref: LM SFD E (ID 2002282), 30-6-2006 to 29-7-2006] $C^\alpha$, where $\alpha=1$ hour.

TABLE 1

| Raw Consumption Data, Resolution: Hours | | | | | | | | | | | | | | |
|---|---|---|---|---|---|---|---|---|---|---|---|---|---|---|
| 0.55 | 0.53 | 0.57 | 0.59 | 0.54 | 0.54 | 0.55 | 0.57 | 1.70 | 0.86 | 2.03 | 1.61 | 1.52 | 1.44 | 5.27 |
| 4.82 | 3.41 | 4.46 | 2.23 | 4.67 | 7.07 | 5.38 | 3.75 | 1.56 | 1.39 | 1.05 | 0.65 | 0.77 | 0.55 | 0.58 |
| 0.54 | 2.35 | 3.91 | 1.17 | 2.70 | 1.55 | 1.65 | 1.38 | 4.34 | 3.40 | 1.29 | 1.35 | 1.53 | 3.79 | 7.07 |
| 3.35 | 3.91 | 1.24 | 1.50 | 1.74 | 0.91 | 0.92 | 0.90 | 0.63 | 2.75 | 4.52 | 4.87 | 6.13 | 6.10 | 4.75 |
| | | | | | ... | | | | | | | | | |
| 7.04 | 7.75 | 6.41 | 7.27 | 5.73 | 5.96 | 0.88 | 1.32 | 0.88 | 0.57 | 0.56 | 0.70 | 0.84 | 3.58 | 3.62 |
| 4.83 | 1.48 | 1.28 | 1.06 | 1.22 | 2.14 | 3.08 | 1.16 | 3.60 | 2.74 | 4.07 | 2.45 | 1.82 | 1.82 | 1.33 |

Table 2 shows $C^\beta$ for resolution $\beta=24$ hours:

$$N' = \frac{N}{\beta} = 30$$

TABLE 2

Consumption Data at 1-Day Resolution

| [1] Fri | [2] Sat | [3] Sun | [4] Mon | [5] Tue | [6] Wed | [7] Thr | [8] Fri | [9] Sat | [10] Mon |
|---|---|---|---|---|---|---|---|---|---|
| 56.186 | 51.502 | 72.864 | 81.64 | 56.909 | 59.756 | 57.13 | 62.92 | 55.822 | 42.429 |
| [11] Tue | [12] Wed | [13] Thr | [14] Fri | [15] Sat | [16] Sun | [17] Mon | [18] Tue | [19] Wed | [20] Thr |
| 48.701 | 52.075 | 57.181 | 69.254 | 53.897 | 41.883 | 60.563 | 39.816 | 55.973 | 61.194 |
| [21] Fri | [22] Sat | [23] Sun | [24] Mon | [25] Tue | [26] Wed | [27] Thr | [28] Fri | [29] Sat | [30] Sun |
| 44.292 | 54.078 | 44.725 | 51.656 | 37.444 | 53.175 | 60.031 | 42.494 | 72.379 | 47.006 |

Finally, Table 3 presents the values for $\mu_t$ and $s_t$:

$$t = \left[1, \frac{P \cdot \alpha}{\beta}\right] = [1, 7],$$

$$d = \left\lfloor \frac{N}{P \cdot \alpha} \right\rfloor = 4$$

TABLE 3

Calculated Mean and Standard Deviation

| τ | μ | s |
|---|---|---|
| 1 (Fri) | 53.29 | 12.5 |
| 2 (Sat) | 56.77 | 4.23 |
| 3 (Sun) | 48.48 | 6.34 |
| 4 (Mon) | 56.88 | 13.0 |
| 5 (Tue) | 51.90 | 20.4 |
| 6 (Wed) | 54.53 | 2.28 |
| 7 (Thr) | 59.54 | 1.69 |

As shown in previously in FIG. 3, the above load profile demonstrates a strong repeating behavior on Wednesday and Thursdays ($s_{wed}$=2.28, $s_{thr}$=1.69), while the behavior on Tuesdays is the least predictive ($s_{tue}$=20.4). Therefore, if a prediction is to be made for a coming Wednesday, $\mu_{wed}$=54.53 can be used as a reliable estimate.

Trend Analysis

Figure 4:
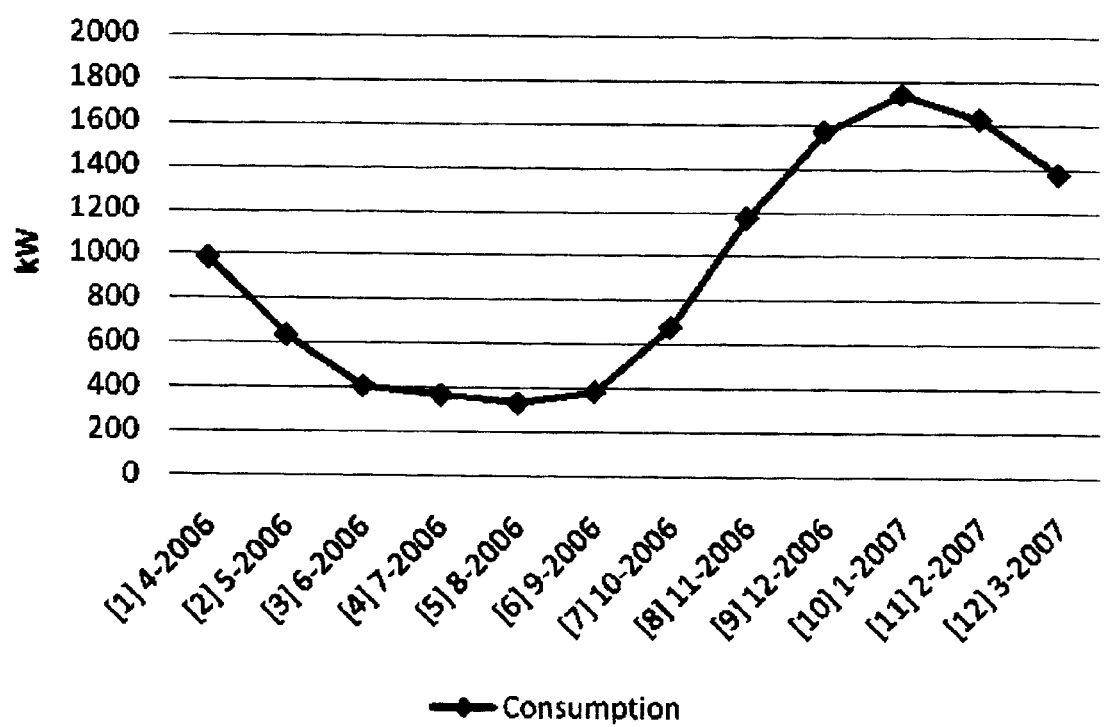
FIG. 4 is a graph showing Monthly Consumption Pattern, Demonstrating Continuous Changes over Time.

Many behavioral changes occur continuously over the course of time. An example of this is shown in FIG. 4. A likely explanation for such smooth transitions is the correlation between consumption behavior and seasonal factors such as weather.

When a user's consumption changes, the average-based 'Pattern Analysis' method would require some time to adjusts its forecasts. This is because the new behavior should represent a significant part of the history-data, before it shows itself in the mean-values. Therefore, the forecast would lag behind such changes.

In order to decrease the response time, consumption trends can be taken into account within the present method and system. While Pattern Analysis examines change in consumption over time, Trend Analysis focuses on the rate of change. As in the above example, the user's consumption increase in December is easily predictable in the previous month. Hence, detecting trends helps the forecast respond to changes quickly, thus increasing the performance index by minimizing error.

Trends can be examined at different time-resolutions and polynomial orders. Lower time-resolution (large β values) make the trend analysis less sensitive to noise—highly deviated data with insignificant forecasting value. Moreover, higher polynomial orders are more responsive to change, but also more sensitive to noise.

After adjusting the consumption data's resolution (same as the initial step in Pattern Analysis), linear regression is used to detect the trend:

$$n\text{:polynomial order}, c = a_0 \cdot x^n + a_1 \cdot x^{n-1} + \ldots + a_{n-1} \cdot x + a_n$$

where x is the time and c is the consumption. The least-squared solution to the above polynomial is:

$m$: data points, $$\begin{bmatrix} c_1 \\ c_2 \\ \vdots \\ c_m \end{bmatrix} = \begin{bmatrix} 1 & x_1 & x_1^2 & \ldots & x_1^n \\ 1 & x_2 & x_2^2 & \ldots & x_2^n \\ \vdots & \vdots & \vdots & \ddots & \vdots \\ 1 & x_m & x_m^2 & \ldots & x_m^n \end{bmatrix} \begin{bmatrix} a_0 \\ a_1 \\ \ldots \\ a_n \end{bmatrix} \rightarrow Y = XA$$

$$X^T C = X^T X A \Rightarrow A = (X^T X)^{-1} X^T C$$

For instance, the solution to a first order polynomial would be:

$$\begin{bmatrix} c_1 \\ c_2 \\ \vdots \\ c_m \end{bmatrix} = \begin{bmatrix} 1 & x_1 \\ 1 & x_2 \\ \vdots & \vdots \\ 1 & x_m \end{bmatrix} \begin{bmatrix} a_0 \\ a_1 \\ \ldots \\ a_n \end{bmatrix}$$

solving for $a'$s:

$$\begin{bmatrix} a_0 \\ a_1 \end{bmatrix} =$$

-continued $$\left(\begin{bmatrix} 1 & 1 & \ldots & 1 \\ x_1 & x_2 & \ldots & x_m \end{bmatrix} \begin{bmatrix} 1 & x_1 \\ 1 & x_2 \\ \vdots & \vdots \\ 1 & x_m \end{bmatrix}\right)^{-1} \begin{bmatrix} 1 & 1 & \ldots & 1 \\ x_1 & x_2 & \ldots & x_m \end{bmatrix} \begin{bmatrix} c_0 \\ c_1 \end{bmatrix}$$

$$\begin{cases} a_0 = \dfrac{\left(\sum_{i=1}^m c_i\right)\left(\sum_{i=1}^m x_i^2\right) - \left(\sum_{i=1}^m x_i\right)\left(\sum_{i=1}^m x_i y_i\right)}{n\sum_{i=1}^m x_i^2 - \left(\sum_{i=1}^m x_i\right)^2} \\ a_1 = \dfrac{n\sum_{i=1}^m x_i y_i - \left(\sum_{i=1}^m x_i\right)\left(\sum_{i=1}^m x_i y_i\right)}{n\sum_{i=1}^m x_i^2 - \left(\sum_{i=1}^m x_i\right)^2} \end{cases}$$

Having solved for a's, the polynomial equation can now be used to determine the consumption at a given time (x) in future.

first order: $tr(x) = a_0 \cdot x + a_1$ n-th order: $tr(x) = a_0 \cdot x^n + a_1 \cdot x^{n-1} + \ldots + a_{n-1} \cdot x + a_n$ The accuracy of the estimated trend line can be measured by:

$$ESS = \sum_{i=1}^m (tr(x_i) - c_i)^2 = C^T C - (X^T X)^{-1} X^T C X^T C$$

Data Expiry

User consumption behavior changes over the course of time and factors such as season can play a significant role in the consumption. As collected load data age, they can potentially become less accurate due to changes in user's life style, season or weather. Therefore, a time will reach when the data 'expire'—e.g. the aged data will not be considered in analysis any more within the method and system of the invention.

There are various advantages and disadvantages to eliminating old data:
a. Advantage: the forecast algorithm responds quickly to changes in behavior.
b. Advantage: less memory is required for storing the aged data.
c. Disadvantage: a temporary change in behavior—a big enough change that is not sustainable enough for forecasting consideration—can significantly affect the forecast (i.e. noise sensitivity).

Each type of pattern or trend calculation can have its own data expiry policy, since different analysis might require various sizes of historic data in order to work well.

Forecast Responsiveness

An important and rather controversial question about PowerTab's forecast algorithm is how responsiveness the forecast shall be to changes in consumption behavior. The method and system of the present invention provide a balance between a non-responsive system and a highly responsive one. For instance, it is not desirable that the forecasted bill increases vividly when a user's consumption doubles for an entire week, nor is it desired that the forecast change notably when a user has done two hours of laundry.

In long term, non-responsive systems produce more accurate forecasts, while the highly responsive ones occasionally react to noisy data and produce inaccurate predictions that lower their overall performance. This is similar to any Control System in which fast response time causes overshoot.

A primary objective of the Smart Budgeting method and system is forecasting the electricity bill based on users current behavior to inform them of how much they will be charged if they continue to consume this way. Therefore, rather than trying to forecast with least possible error, the forecast value/end product of one aspect of the present invention, ties itself greatly with user's current consumption behavior. For example, if a user over-consumes for a few days in a row, our system should increases its bill estimation to warn the user about their behavior. If the users over-consumption days are temporary, the increased estimation introduces error and a non-sensitive forecast system can eliminate that error; however, based on the intended application of the forecast system, a consistent over-consumption behavior is worthy of warning and hence the error factor is not as important as this objective.

Two factors play a role in the forecast responsiveness: trends, and data expiry periods. Trends play the most significant role in responsiveness since they attempt to forecast based on the recent user behaviors (e.g. the last data points in the trend calculation considerably affect the trend forecast). This makes the trend analysis very sensitive to noise—highly deviated data with insignificant forecasting value. One way to lessen this over-responsiveness is to use trends on low-resolution data (large β value such as days or weeks) and hence reducing the noise sensitivity.

Additionally, the length of the data history used for pattern and trend calculations is another important factor in sensitivity of the forecast system. This concept was introduced in the Trend Analysis discussion above. While the 'noise sensitivity' created by Data Expiry can be disadvantageous to a generic forecast algorithm, it will in fact be advantageous to the intent of the Smart Budgeting method and system. The present invention does indeed require responsiveness to user's behavior in order to inform them of the consequences of their current consumption habit. And therefore, the only forecasting drawback of the Data Expiry is in fact useful for PowerTab. The expiry period has to be chosen delicately in order to maintain reasonable responsiveness.

Integration

Various patterns and trends can exist for any given user at any given time. An important step toward a reliable forecast is integrating all patterns and trends to obtain a concise outcome. The integration needs to be proportional—a more accurate pattern/trend should affect the outcome more significantly than a less accurate one. The accuracy of a pattern is inversely proportional to $s_t$ (standard deviation) at given time, and the accuracy of a trend is inversely proportional to ESS.

The Smart Budgeting method and system starts with integrating all patterns first, before applying the trends:

for k patterns and trends, $^u\mu_x, {}^u s_x$: mean and standard deviation at time x for pattern u $^x tr(x), {}^v ESS$: trend estimate and error at time x for trend v $$\begin{cases} u: \text{pattern}, & {}^u p_x = {}^u\mu_x \\ u: \text{trend}, & {}^u p_x = {}^u tr(x) \end{cases}$$

$$w(x) = \sum_{v=1}^k \frac{1}{{}^v s_x},$$

-continued $$P(x) = \sum_{u=1}^{k} \frac{{}^u p_x \cdot \frac{1}{{}^u s_x}}{w(x)}$$

where w(x) represents the total weight of all pattern forecasts at time x, and f (x) represents the final forecast value. The above method applies to patterns/trends of the same time-resolution. Those of varying resolution can be combined when they are converted to the lowest time-resolution:

$$p^\alpha = \{p_1^\alpha, p_2^\alpha, \ldots, p_N^\alpha\},$$

α: resolution,

β: new resolution,

β > α

$$\left\{ \forall i: (t-1) \cdot \frac{\beta}{\alpha} < x_i \leq t \cdot \frac{\beta}{\alpha} \mid {}^u p_t^\beta = \sum_i {}^u p_i^\alpha \right\}$$

$$P(x) = {}^{hi}p_x^\beta \cdot \frac{{}^{lo}p_x^\alpha}{{}^{lo}p_{t:(x \in t)}^\beta},$$

$$'s_x^\alpha = {}^{lo}s_x^\alpha \cdot \frac{{}^{lo}p_x^\alpha}{{}^{lo}p_{t:(x \in t)}^\beta}$$

Preferably, the following steps are taken to integrate all patterns:
  Integrate all patterns of the highest resolution. Since trends are only used at lower resolution, no trend would be integrated at this step.
  Integrate all patterns/trends of the next highest resolution.
  Use the technique for varying resolutions to integrate the last two outcomes.
  Repeat steps b and c until no lower resolution pattern exists.

Since user behaviors vary diversely, not every pattern or trend analysis may highlight a useful repeating behavior. However, using the above integration approach, many patterns and trends proportional to their forecasting strength can be integrated, and in a dynamic, time-efficient manner.

If after further examination of user behaviors it is discovered that a substantially small group of users has a very distinct yet strong behavioral pattern, an appropriate pattern analysis component can be added to the method and system for those users. This addition would strongly improve forecasting performance for those niche users, while not at all degrading the performance for all other users who do not behave that way. This feature of the present "integration approach" makes the method and system very sustainable for future research and customization to new markets.

Examination

Using the load profile data of 17 households over a course of a year, the above principles were adopted to PowerTab's specifications. Two patterns (daily-hours and weekly-days) and one trend (first-order weekly-based) were found sufficient for an accurate forecasting capability.

Pattern: Daily-Hours

The highest possible time-resolution of a forecast is equal to the highest time-resolution of the analyzed patterns. Therefore, to be able to make hourly forecasts, patterns of hourly behavior were preferably analyzed. Clearly, the most useful hourly-based pattern can be calculated for a period-length of one day—hence the name Daily-Hours. Daily-Hours analysis has proved itself very helpful for forecasting, because time of day is one of the most significant parameters for user's behavior.

A considerable majority of users have a very low-deviating behavior over sleeping hours. Yet, the behavior during the daytime varies. FIG. 2 demonstrates this fact as the deviation in early hours of a day is rather minimal, while the deviation of the later hours of the day varies significantly.

The data-expiry limit for daily-hour analysis is set to 30 days (i.e. data older than 30 days are not used for this analysis). The 30 days limit is set in order to keep the algorithm responsive to changes in daily behavior, while making sure it is not too sensitive to noise and outliers.

The data-expiry limit for weekly-day analysis is set to 60 days (i.e. data older than 60 days are not used for this analysis). This limit provides an average of 8 samples for each day of the week, which is rather minimal for an accurate averaging. Meanwhile, extending the data-expiry beyond 60 days is dangerous because after two month, those data can be obsolete for forecasting purposes (i.e. high possibility that user's consumption behavior has changed significantly).

Trend: First-Order Weekly-Based

Based on data acquired, a trend line on a weekly time-resolution and using a first-order polynomial fitting has proved itself very useful for accurate forecasting. Any time-resolution higher than one week is prone to frequent error due to noise and outliers. Moreover, $1^{st}$ order, $2^{nd}$ order and $3^{rd}$ order polynomials were experimented with. While $2^{nd}$ and $3^{rd}$ order perform better estimates at various occasions, the overall performance of the $1^{st}$ order regression was better.

The data-expiry limit for the weekly trend analysis is set to 60 days (i.e. data older than 60 days are not used for this analysis). This limit provides 8 data points (weeks) for trend-line calculation. This is rather minimal for accurate trend estimation. Meanwhile, extending the data-expiry beyond 60 days is dangerous because after two month, those data can be obsolete for forecasting purposes (i.e. high possibility that user's consumption behavior has changed significantly).

Importantly, it was discovered that the weekly-based trend analysis creates a suitable responsiveness for the forecast algorithm. As soon as a user spends a good portion of a week (3 days or more) over-consuming, the weekly consumption for the most recent week increases, causing the trend-line to shift upward. This effect increases the forecast estimate of the upcoming days. The increase helps warn users about the value of their next bill, if they continue their recent consistent over-consumption behavior.

Absence Detection

Two types of patterns exist: repeating, and non-repeating. Repeating patterns are useful to forecasting (e.g. sleeping hours), while non-repeating patterns—statistical outliers—are misleading. Outliers are infrequent in nature, and since our approach is based on averaging, they are insignificant to the outcome.

Behavioral outliers exist as well—non-repeating behavioral patterns that deviate from standard. However, as opposed to statistical outliers, behavioral outliers are not always infrequent. Vacation periods are a perfect example of non-infrequent behavioral outliers. Due to their length in time, these behavioral outliers can affect the forecast outcome significantly. For instance, a three-week vacation period can completely mislead the forecast algorithm's expectation of the user's behavior.

In this case, an absence detection mechanism is implemented with the Smart Budgeting method and system of the present invention which excludes from the forecast algorithm, the periods in which no user is at home. One can easily spot absence periods when looking at the consumption graphs. That is due to human brain's highly capable pattern recognition skills. Absence periods share two characteristics: first, the usage is observably lower than typical consumption periods; this property, however, does not help detecting absence times since both the magnitude of consumption, and the ratio of absence consumption to typical consumption, are rather hard to define as they vary from one user to another.

The second characteristic of an absence period is its low deviation in the consumption record; since no person is present at home, the changes occurred in the consumption are significantly smaller than that of a typical period. Some time-varying electric appliances such as thermostat heater or air conditioner, however, can introduce deviations to the power consumption during absence periods. Two solutions may be introduced to the Smart Budgeting method and system, and when combined, they can solve this problem:

Defining consumption deviation tolerance ranges based on a percentage of the typical consumption deviation. If deviation is higher, someone is present; if it is lower, no one is.

Use of the previous day's absence status: If a user was absent yesterday, s/he might be on vacation and hence s/he is more likely to be absent today.

Utilizing fuzzy logic, this two decision methods can be combined based on the following table:

TABLE 4

Fuzzy Logic Table for Absence Detection

| | | YESTERDAY | | |
|---|---|---|---|---|
| | Yes | Likely | Unlikely | No |
| TODAY Yes | True | True | True | False |
| Likely | True | True | False | False |
| Unlikely | True | False | False | False |
| No | True | False | False | False |

Figure 7:
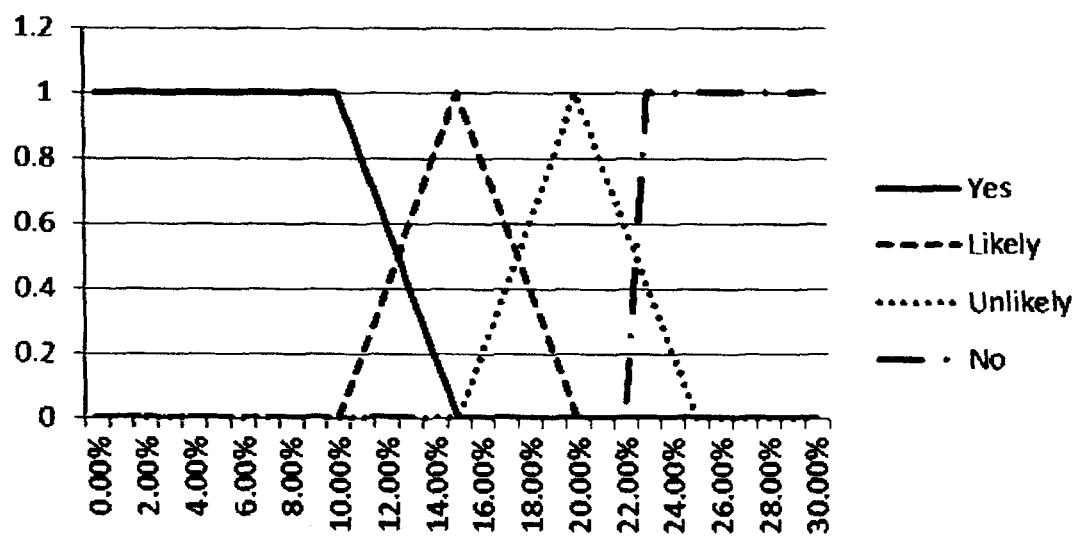
FIG. 7 is a graph showing the absence detection Fuzzy Sets.

The four fuzzy sets of "Yes," "Likely," "Unlikely" and "No" are defined as provided in FIG. 7.

Finally, to calculate the values for "today" and "tomorrow" variables, we use the following set of equations:

$$\mu = \frac{1}{24} \sum_{i \in P} C_i,$$

$$s = \sqrt{\frac{1}{23} \sum_{i \in P} (C_i - \mu_{day})^2}$$

$$s_{today} = s(P = \text{today's consumption data})$$

$$s_{yesterday} = s(P = \text{yesterday's consumption data})$$

$$s_{all} = s(P = \text{entire consumption data})$$

$$\text{today} = \frac{s_{today}}{s_{all}},$$

$$\text{yesterday} = \frac{s_{yesterday}}{s_{all}}$$

To elaborate on the above equations, the ratio of the today and yesterday's hourly standard deviation, over the overall hourly standard deviation. If the ratio value is reasonably small in both days, that shows a lower than usual daily consumption deviation, which helps detect absence of users.

Light Indicator

Among the most important features of the PowerTab is its light indicator that provides instantaneous feedback to user's consumption behavior to help them lower their consumption within their targeted budget. The light indicator has two states: Red representing overconsumption, and Green representing proper consumption. When the light is red, the user is expected to take measures to lower their consumption; and when the light is green, the user is notified that their current behavior would achieve the target.

Budgeting

The light indicator uses the user-inputted target bill value, the dollar consumption so far, and the user's forecasted behavior in order to determine an hourly budget for the remaining part of the billing cycle. The operation is performed as follows:

given: t∈Q, Q: remaining period in the current billing cycle

T: target budget ($), S: spent so-far ($), $g_t$:cost of 1 kwh at time t $f_t$: forecasted consumption (kwh) at time t, $s_t$: forecast's deviation at time t First, within one embodiment of the Smart Budgeting method and system, the remaining dollars to be spend during the remaining days of the current billing cycle is calculated:

$$R:\text{remaining budget } (\$), R = T - S$$

Next, a budget for every remaining hour of the billing cycle, based on both the forecasted spending and its possible deviation, is specified:

Case 1)

If the unconsumed budget is more than forecasted spending: the extra money will be divided between all remaining hours, proportional to the forecast deviation. For instance, since the deviation is small during sleeping hours, not much of the extra money will be devoted to those hours since the user clearly does not need much room there. However, during hours where the user does not spend consistently, he/she will be given additional budget.

Case 2)

If there is some money left in the budget (unconsumed budget >0), yet the left-over is less than the forecasted consumption: this means that the user is over-consuming, so his/her hourly forecasted consumption should be reduced. When giving extra money to each hour, this was allocated proportionally to each hour's consumption deviation. However, when shrinking the consumption, the method and system of the present invention does it proportional to the forecasted consumption itself. That is because one end goal of Smart Budgeting is to encourage the user to adopt a more conservative behavior by saving at all times. Even during sleeping hours when the deviation is low, turning off an extra appliance might be the key in achieving the target bill, and therefore he/she is asked to lower every hour of consumption by a certain percentage rather than considering the deviation patterns.

Case 3)

Finally, if the amount of money spent so far is more than the total budget (remaining budget <0), then the user cannot achieve his/her goal and a $0 budget for every remaining hour is specified.

The above policies are implemented within the Smart Budgeting method and system and represented in the following equations:

$F$: forecasted spending($), $$F = \sum_{t \in Q} f_t \cdot g_t,$$

-continued $$\begin{cases} R > 0 \cdot R \geq F: & B_t = f_t \cdot g_t + \rho \cdot \frac{S_t}{\sum_{u \in Q} S_u}, \text{ where } \rho = R - F \\ R > 0 \cdot R < F: & B_t = f_t \cdot g_t \times \frac{R}{F} \\ R < 0: & B_t = 0 \end{cases}$$

State Determination

Once the consumption budget of the remaining billing period is determined, the light indicator should decide whether the user is over-consuming (red or green light). The most important criterion for state determination is whether the consumption of this hour is less than or equal to this hour's budget:

$$\text{rule \#1:} \begin{cases} \text{under-consumption} & C_{now} \cdot g_{now} \leq B_{now} \\ \text{over-consumption} & C_{now} \cdot g_{now} > B_{now} \end{cases}$$

Considering the following scenario: a user's budget is $70. It is the $6^{th}$ week of the 8-week long billing period, and she has spent $30 so far. Therefore, the user has 2 weeks left and $40 to spare, which means her consumption can triple and still the target budget will be met. If the user decides to do 3 hours of doing laundry, cooking dinner, ironing and watching TV all at the same time, she will surpass her hourly budget. Should she be warned about this?

A reasonable answer to this question is 'no', because the user has a considerable amount of budget left and it is very clear that a mere 3 hour of overconsumption would not challenge the achievability of her target bill, due to her fine record of under-consumption. However, if the above rule were to be considered independently, the light indicator would go red which would come as a surprise to the user. Such unreasonable judgment by PowerTab can seriously challenge its trustworthiness for helping users conserve, which is its primarily objective.

To rectify the above problem, a new criterion is introduced within the method and system of the invention which adds a 'consistency' factor to the decision of whether a user is overconsuming. In other words, not only the user should be consuming more than the current hour's budget, she should be consistence in it for a short period to receive a warning. To do so the light indicator looks into user's last 24 hours of consumption, and if there is a left-over budget within this time, it uses that to tolerate the current over-consumption:

$$\text{rule \#2:} \begin{cases} \text{under-consumption} & \sum_{t \in \text{last 24 hours}} C_t \cdot g_t \leq \sum_{t \in \text{last 24 hours}} B_t \\ \text{over-consumption} & \sum_{t \in \text{last 24 hours}} C_t \cdot g_t > \sum_{t \in \text{last 24 hours}} B_t \end{cases}$$

The light indicator state will be determined based on the rule #1 and rule #2, as follows:

$$\text{state:} \begin{cases} \text{red:} & (role\#1 = OC) \cdot (role\#2 = OC) \\ \text{green:} & \text{otherwise} \end{cases}$$

Based on the above system, few hours of over-consumption can be tolerated if the user's overall behavior is conservative enough. The following scenarios elaborate the capabilities of the Smart Budgeting method and system:

Case A:

A user's budget for the last 24-hour period was $2.4 and his current hour's budget is $0.12. He has consumed $2.1 during this day. If he consumes more than $0.12 this hour, rule #1 would indicate overconsumption; however, rule #2 would not, and therefore the light will be green. However, this tolerance will be exhausted as soon as the user consumes anything more than $0.3 within this hour (excessive overconsumption).

Case B:

If the above user has spent $3 within the last day, rule #2 would indicate overconsumption, even if the user is spending less than his $0.12 budget for current hour. However, the light would still show green, because the extra consumption has already been deducted from user's future budgets (hence shrinking the 0.12$ slightly). Thus, if the user is currently spending 0.06$, he would correctly see a green light indicating that if he continues to do what he is doing 'right now', he would be achieving his consumption goal. But as soon as he passes the hourly budget, he would see a red-light since there is no tolerance to further overconsumption.

Case C:

If a user has a $100 budget, and he has only spent $30 seven weeks into the period, he would have a $10 per day budget for the remaining days. If he spends $3 in 23 hours, he would still have $7 to spare in one hour which means he would not get an overconsumption alarm that easily (i.e. very high tolerance).

Dependency on Forecast Algorithm

As demonstrated herein, the forecast value for each hour is the base for its budget determination. An alternative is to use no forecasting and evenly divide the remaining dollars of the budget over every hour. A user's hourly behavior is not even; in some hours the consumption is low (e.g. when sleeping) and in some hours the consumption is high (e.g. evenings). However, if every hour is budgeted evenly, the system would always indicate a green light during sleeping hours, even if the user has forgotten to turn off the TV; and it would always show red light during evenings, even if the user has consumed less than usual.

The other side of the extreme is if it is known 'exactly' how the user is going to behave. In that case, the user would never see a red light if his future behavior would be meeting the budget requirement, even when he is consuming excessively for a few hours—since his behavior and excessive consumption is known and expected, it is known that it would not cause him to go over the budget. However, if the user's behavior leads to surpassing the budget, the system would shrink every future hour's consumption by a needed percentage to meet the budget. It would then use the light indicator to encourage the user to follow within those defined limits. If it is the beginning of the billing cycle, the user would see green light every now and then. However, if the end of the cycle is approaching and the user is still over-consuming, the saving percentage grows higher and higher and it would become almost impossible for the user to lower his consumption to that extend. Therefore, no green lights will be shown anymore indicating that it is not very likely for the user to meet his intended budget.

This is the ideal case, because the light indicator's purpose to answer the following question is met perfectly: is the user going to go over his budget? The more accurately the user's behavior can be forecasted using the Smart Budgeting method and system, the less 'false positives' and 'false negatives' would show.

Potential Features

Using the same principles used in forecasting, absence detection and light indication, the following features can be implemented as additional embodiments of the Smart Budgeting method and system:

Sleep-Prep: The system can determine the usual sleeping hours and patterns of a user. Hence, during the hours in which the user usually goes to bed, an icon can appear on the screen showing whether the household is 'sleep ready'. The system determines the sleep-readiness by analyzing a user's usual sleeping pattern and his budget for those hours. If the current consumption is similar to that of the user's usual sleeping hours and he is within the budget, the system provides a positive feedback. However, if an extra light is left on, a warning can be displayed to notify the user Leave-PreP: The same idea as the 'sleep-prep' can be applied for when the user is leaving home especially for longer periods (e.g. vacations). In this case, the user might need to press a button on their In-Home Display, smartphone or tablet app, etc. to ask for verification that the house is 'at rest' (minimum power consumption). The system then analyzes previous absence patterns to determine whether an unnecessary appliance is left on or if house is "leave ready". The system could also analyze user's behavior and detect when they may leave the premises (based on previous behavior, or other available signals) and proactively inform users if their home is "leave ready.

Today's Performance: A simple addition to PowerTab can provide a feedback about user's every day performance rather than that of the entire billing cycle. The system can interpolate today's consumption over the remaining days of the billing cycle and generate a forecast based on today's performance. This forecast would vary greatly from one day to another and is not to be trusted as the final bill's value. However, it can help user understand how he has performed today. Also, this would make the device interactive as the users will have a daily-based challenge; they can set new 'records' by trying to lower than number, and they would not need to wait longer before seeing the effect of their effort. Users may also use social media to share such data and "compete" with neighbours based on performance indicators and other power usage metrics.

Absence Battery Saving: When the forecast algorithm detects that the user is absent, it can turn PowerTab off in order to save battery. As soon as someone comes back, the system can detect that by observing the sudden jump in the consumption (turning on lights, etc.) and the device can turn itself on again.

Sleeping-Hours Battery Saving: The same absence battery saving idea applies to the sleeping hours. Again the device can forecast sleeping hours, detect it when a user goes to bed, and turn itself off until changes in the consumption indicate the user's awakeness. The PowerTab can automatically turn its display on during morning hours when the user wakes up because it is likely for the user to pass by.

Interfacing With Appliances: Provision and conveyance of information about user's daily behavior to other appliances. Using the PowerTab, all appliances can be triggered when user sleeps, wakes up, leaves home, goes on vacation, etc. . . . and all this information is detected by the PowerTab without any user interaction.

Preferred Aspects of FHMM

For a FHMM with N HMMs, there is the following statistical model:

$$\prod_k^{(s)} : P(x_1^{(s)} = k) = Multi(\phi^{(s)}),$$

$$A_{ij}^{(s)} : P(x_t^{(s)} = j \mid x_{t-1}^{(s)} = i) = Multi\left(P_{x_{t-1}^{(i)}}^{(i)}\right),$$

$$P(y^{(i)} \mid x_t^{(i)}) = N\left(\mu_{x_t^{(i)}}, \sum\right),$$

$$\bar{y}_t = \sum_{i=1}^N y_t^{(i)},$$

$$P(\bar{y}_t \mid x_t^{(1:N)}) = N\left(\sum_{i=1}^N \mu_{x_t^{(i)}}^{(i)}, \sum\right),$$

where $X_t^{(i)}$ is the status variable for the $i_{th}$ HMM at time t, $y_t^{(i)}$ is the latent output for this HMM at time t, and $\bar{y}_t$ is the true observation at time t of this FHMM, which is the summation of all $y_t^{(i)}$'s. N stands for normal distribution and Multi stands for multinomial distribution.

All the parameters in the statistical model described above are estimated from the real power data. The EDHMM-dif model is designated to perform estimation from aggregated power data.

EDHMM-diff

For the HMM within the FHMM, there is devised an EDHMM-diff model (i is omitted here)

$$\Pi_k : P(x_1 = k),$$

$$A_{ij} : P(x_t = j \mid x_{t-1} = i),$$

$$\Delta y_t = y_t - y_{t-1},$$

$$P(\Delta y_t \mid x_t, x_{t-1}) = N(\mu_{x_t} - \mu_{x_{t-1}}, \sigma_{x_t}^2 + \sigma_{x_{t-1}}^2),$$

$$P_k(d) = P(x_{t:t+d-1} = k),$$

where most of the variables have the same meaning as the ones noted above. It is worth noting that in EDHMM-diff the differential observation $\Delta Y_t \cdot P_k(d)$ is modelled. $P_k(d)$ is the probability for this HMM stays at status k for a duration d, where $x_{t:t+d-1}$ means all the points x from time t to time t+d−1, which are d points in total. All the parameters of EDHMM-diff are estimated from the real power data, including the probability distribution $P_k(d)$. To estimate a single HMM from the aggregated power data is not possible using all the previous methods of the art, hence the importance of the EDHMM-diff to this preferred method of LD.

In operation, the use of EDHMM-diff to "detect-and-tune" is as follows: for an EDHMM-diff model, the set of parameters θ can describe the whole model. Within the scope of the invention, there is provided a library of θ's for a plurality of common appliances, which are estimated from power signals collected from standard appliances. The true $\theta^{(i)}$ for an appliance i in some house may be different from the $\theta_{lib}^{(i)}$ so prepared, due to the difference between real appliances. It is required to estimate the true $\theta^{(i)}$ from the real aggregated power data in testing. Taking a fridge as an example First, a set of sliding windows on the power signal is defined, then the signal within the window is denoted by $Y_{min}$ for window s. Second, the likelihood for this signal clip is computed given model $\theta_{lib}^{fridge}$ y EDHMM-diff, the likelihood is $$P(y_{win_s} \mid \theta_{lib}^{fridge}). \tag{1}$$

If this likelihood larger than certain threshold, it is kept as a valid set $S_v$. After detecting valid signal clips through the power signal, a set $S_v$ is acquired that contains signals generated by the fridge in this house. Then $S_v$ is used to estimate the EDHMM-diff to get a true $\theta^{fridge}$ for this house, which is different from the $\theta_{llb}^{fridge}$. At last, this $\theta^{fridge}$ is used as the estimated parameters for FHMM to perform disaggregation.

Estimation and Inference of EDHMM-diff

A forward-backward algorithm for difference HMM with explicit duration.

1 Forward
Definition:

$$\bar{\alpha}_t(j) = P(s_t = j \mid Y_{2:t})$$
$$\bar{\alpha}_t^*(i, j) = P(s_t = i, s_{t+1} = j \mid Y_{2:t})$$
$$\bar{\gamma}_t(d) = P(Y_{t-d+1:t} \mid Y_{2:t-d})$$
$$\bar{u}_t(i, j, d) = \frac{u_t(i, j, d)}{\bar{\gamma}_t(d)}$$
$$= \frac{P(Y_{t-d+1:t} \mid s_{t-d} = i, s_{t-d+1:t} = j)}{P(Y_{t-d+1:t} \mid Y_{2:t-d})}$$

Induction:

$$\bar{\alpha}_t(j) = \sum_{d \in D} \sum_{i \in S/\{j\}} \bar{\alpha}_{t-d}^*(i, j) P_j(d) \bar{u}_t(i, j, d)$$
$$\bar{\alpha}_t^*(i, j) = \bar{\alpha}_t(i) A_{ij}$$
$$\bar{\gamma}_t(d) = \sum_{j \in S} \sum_{i \in S/j} \bar{\alpha}_{t-d}^*(i, j) P_j(d) u_t(i, j, d)$$

Notes on derivation:

$$\gamma_t(i, j, d) = \bar{\alpha}_t^*(i, j) P_j(d) u_t(j, d)$$
$$= P(s_{t-d} = i, s_{t-d+1} = j \mid Y_{2:t-d}) P(\tau = d \mid s_{t-d} = i, s_{t-d+1} = j)$$
$$P(Y_{t-d+1:t} \mid s_{t-d} = i, s_{t-d+1:t} = j)$$
$$= P(s_{t-d} = i, s_{t-d+1:t} = j \mid Y_{2:t-d}) P(Y_{t-d+1:t} \mid s_{t-d} = i, s_{t-d+1:t} = j)$$
$$= P(s_{t-d} = i, s_{t-d+1:t} = j, Y_{t-d+1:t} \mid Y_{2:t-d})$$

Initialization:

$$\alpha_2(j) = P(s_2 = j \mid Y_2)$$
$$= \sum_i P(Y_2 \mid s_1 = i, s_2 = j) P(s_2 = j \mid s_1 = i) \pi_i$$
$$\bar{\alpha}_2(j) = \frac{\alpha_2(j)}{\sum_i \alpha_2(i)}$$

Likelihood:

$$\gamma_t(1) = P(Y_t \mid Y_{2:t-1})$$
$$P(Y_{2:T}) = \prod_{t=3}^{T} \bar{\gamma}_t(1)$$

2 Backward
Definition:

$$\bar{\beta}_t(j) = \frac{P(Y_{t+1:T} \mid s_t = j)}{P(Y_{t+1:T} \mid Y_{2:t})}$$
$$\bar{\beta}_t^*(i, j) = \frac{P(Y_{t+1:T} \mid s_t = i, s_{t+1} = j)}{P(Y_{t+1:T} \mid Y_{2:t})}$$

Induction:

$$\bar{\beta}_t^*(i, j) = \sum_{d \in D} \bar{u}_{t+d}(i, j, d) P_j(d) \bar{\beta}_{t+d}(j)$$
$$\bar{\beta}_t(j) = \sum_{k \in S} \bar{\beta}_t^*(j, k) A_{jk}$$

Notes on derivation:

$$\bar{u}_{t+d}(i, j, d) = \frac{P(Y_{t+1:t+d} \mid s_t = i, s_{t+1:t+d} = j)}{P(Y_{t+1:t+d} \mid Y_{2:t})}$$
$$P_j(d) = P(\tau_{t+1} = d \mid s_t = i, s_{t+1} = j)$$
$$\bar{\beta}_{t+d}(j) = \frac{P(Y_{t+d+1:T} \mid s_{t+d} = j)}{P(Y_{t+d+1:T} \mid Y_{2:t+d})}$$
$$\bar{u}_{t+d}(i, j, d) P_j(d) = P(s_{t+2:t+d} = j \mid s_t = 1, s_{t+1} = j) \bar{u}_{t+d(i,j,d)}$$
$$= \frac{P(Y_{t+1:t+d}, \tau = d \mid s_t = i, s_{t+1} = j)}{P(Y_{t+1:t+d} \mid Y_{2:t})}$$

$$\bar{u}_{t+d}(i, j, d) P_j(d) \bar{\beta}_{t+d}(j) = \frac{P(Y_{t+1:t+d}, s_{t+d} = j, \tau = d-1, \mid s_t = i, s_{t+1} = j)}{P(Y_{t+1:t+d} \mid Y_{2:t}) P(Y_{t+d+1:T} \mid Y_{2:t+d})}$$
$$= \frac{P(Y_{t+1:T}, \tau = d \mid s_t = i, s_{t+1} = j)}{P(Y_{t+1:T} \mid Y_{2:t})}$$
$$= \bar{\beta}_t^*(i, j)$$

Initialization:

$$\bar{\beta}_{T-1}^*(i, j) = \frac{P(Y_T \mid s_{T-1} = i, s_T = j)}{P(Y_T \mid Y_{1:T-1})}$$
$$= \bar{u}_T(i, j, 1)$$
$$\bar{\beta}_{T-1}(j) = \frac{P(Y_T \mid s_{T-1} = j)}{P(Y_T \mid Y_{1:T-1})}$$

3. Estimation
Definition:

$$\bar{\gamma}_t(j) = P(s_t = j \mid Y_{2:T}) = \bar{\alpha}_t(j) \bar{\beta}_t(j)$$
$$\eta_t(j, d) = P(s_t = j, \tau = d \mid Y_{2:T}) = \bar{\alpha}_t(j, d) \bar{\beta}_t(j)$$
$$\bar{\alpha}_t(j, d) = P(s_t = j, \tau = d \mid Y_{2:t})$$
$$\xi_t(i, j) = P(s_t = i, s_{t+1} = j \mid Y_{2:T}) = \bar{\alpha}_t^*(i, j) \bar{\beta}_t^*(i, j)$$

Parameter Updata:

$$A_{ij} = \sum_t \xi_t(i, j) \bigg/ \sum_{j \in S/i} \sum_t \xi_t(i, j)$$

$$P_j(d) = \sum_t \eta_t(j, d) \bigg/ \sum_d \sum_t \eta_t(j, d)$$

$$\mu_{ij} = \sum_{t=3}^{T} \mathcal{Y}_{t-1}(i) \mathcal{Y}_t(j) Y_t \bigg/ \sum_{t=3}^{T} \mathcal{Y}_{t-1}(i) \mathcal{Y}_t(j)$$

$$\sigma_{ij}^2 = \sum_{t=3}^{T} \mathcal{Y}_{t-1}(i) \mathcal{Y}_t(j)(Y_t - \mu_{ij})^2 \bigg/ \sum_{t=3}^{T} \mathcal{Y}_{t-1}(i) \mathcal{Y}_t(j)$$

$$\pi_j = \mathcal{Y}_2(j) \bigg/ \sum_j \mathcal{Y}_2(j)$$

While the forms of method and system described herein constitute preferred embodiments of this invention, it is to be understood that the invention is not limited to these precise forms. As will be apparent to those skilled in the art, the various embodiments described above can be combined to provide further embodiments. Aspects of the present systems, methods and data collection means (including specific components thereof) can be modified, if necessary, to best employ the systems, methods, nodes and components and concepts of the invention. These aspects are considered fully within the scope of the invention as claimed. For example, the various methods described above may omit some acts, include other acts, and/or execute acts in a different order than set out in the illustrated embodiments.

Further, in the methods taught herein, the various acts may be performed in a different order than that illustrated and described. Additionally, the methods can omit some acts, and/or employ additional acts.

These and other changes can be made to the present systems, methods and articles in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

The invention claimed is:

1. A computer implemented method of modeling power usage within a macrogrid, the macrogrid being within a region, the method comprising:
   a) obtaining, by a processor, disaggregated power consumption data from at least one premises within the macrogrid to determine at least one behavioral pattern according to usage behaviors for at least two appliances within the premises based on:
      storing, in a database, power signal clips of model appliances that are comparable to the appliances;
      creating, for each of the appliances, a model power draw based on a Hidden Markov Model (HMM);
      estimating a Factorial HMM for the appliances using an Explicit Duration HMM with Difference Observations, the estimating based on the model power draws;
      tuning one or more parameters of said Factorial HMM based on a comparison, of signal clips of power consumed at the premises that include power signal clips of the appliances, with the power signal clips of the model appliances;
      calculating a difference between a total power draw of the appliances at a first time and the total power draw of the appliances at a preceding time; and
      determining whether a state of a maximum of one of the appliances has changed, based on said difference;
   b) obtaining, by the processor, data relating to the at least one behavioral pattern and a state of a user;
   c) obtaining, by the processor, data relating to at least one external impact on the user's power usage within the premises, said external impact originating from an environment of the user and not from the user;
   d) using, by the processor, the obtained data from one or more of a) to c) to create an individual consumer forecast of power usage, said consumer forecast being collectively aggregated across a plurality of users;
   e) using, by the processor, data from one or more of a) to d) to perform a demographic analysis;
   f) collecting, by the processor, macrogrid aggregate power consumption data for the region;
   g) determining, by the processor, power consumption requirements across the macrogrid for the region using data from at least one of a) to e); and
   h) determining, by the processor, future power requirements within the macrogrid, using the data obtained in at least one of a) to g).

2. The method of claim 1 wherein said determining the future power requirements is performed for at least one the following: decreasing and tracking consumer usage of a power resource, decreasing consumer costs for power, maximizing revenue for a power provider, minimizing consumer discomfort, and identifying future peak usage times and requirements.

3. The method of claim 1 wherein said determining whether the state of a maximum of one of the appliances has changed is also based on a duration of how long said one appliance has been in the state up to said first time.

4. A computer implemented method of modeling power usage within a macrogrid for a region, the method comprising:
   a) periodically receiving, by a processor, granular power consumption data from a statistically significant portion of a target population of power users within the macrogrid for the region;
   b) using, by the processor, the power consumption data to perform a consumer load disaggregation to determine usage behaviors for at least two appliances at a premises based on:
      storing, in a database, power signal clips of model appliances that are comparable to the appliances;
      creating, for each of the appliances, a model power draw based on a Hidden Markov Model (HMM);
      estimating a Factorial HMM for the appliances using an Explicit Duration HMM with Difference Observations, the estimating based on the model power draws;
      tuning one or more parameters of said Factorial HMM based on a comparison, of signal clips of power consumed at the premises that include power signal clips of the appliances, with the power signal clips of the model appliances;
      calculating a difference between a total power draw of the appliances at a first time and the total power draw of the appliances at a preceding time; and
      determining whether a state of a maximum of one of the appliances has changed, based on said difference;

c) obtaining, by the processor, data relating to at least one behavioral pattern and a state of a user;
d) obtaining, by the processor, data relating to external impacts on the user's power usage within the premises, said external impact originating from an environment of the user and not from the user;
e) using, by the processor, obtained data from at least one of a) to d) to generate an individual consumer forecast of power usage, the consumer forecast being collectively aggregated across a plurality of users;
f) using, by the processor, data from one or more of a) to e) to perform a demographic analysis;
g) collecting, by the processor, aggregate power consumption data for a region associated with the macrogrid;
h) determining, by the processor, power consumption requirements across the macrogrid for the region using data from at least one of more of a) to g); and
i) determining, by the processor, future power requirements within the macrogrid, using the data obtained in at least one of a) to h).

5. The method of claim 4 wherein periodically comprises receiving data within a five minute interval or less.

6. The method of claim 5 wherein said external impacts are selected from any one of: weather patterns and predictions, calendar month, economic indicators, world events, television programming, equipment age and maintenance, and population mobility.

7. The method of claim 5 wherein the at least one behavioral pattern comprises data related to user behavioral states selected from one or more of the following states: sleeping, just awoken, on vacation, working from home, charging electric vehicles, and extended absence.

8. The method of claim 4 wherein periodically comprises receiving data within a one hour interval or less.

9. The method of claim 4 wherein said determining the future power requirements is performed for at least one the following: decreasing and tracking consumer usage of a power resource, decreasing consumer costs for power, maximizing revenue for a power provider, minimizing consumer discomfort, and identifying future peak usage times and requirements.

10. The method of claim 4 wherein the target population is selected from at least one of: consumers, commercial operations and industrial operations.

11. The method of claim 4, wherein the statistically signification portion is a population sample which is larger than or equal to a smallest possible sample for which the behavioral patterns of the entire population can be observed and modeled within a required accuracy.

12. A system for modeling power usage within a macrogrid for determining future power requirements within the macrogrid, the system comprising a server and one or more databases, the server comprising a processor and memory, the memory comprising computer executable instructions which, when executed by the processor cause the server to:
a) obtain disaggregated power consumption data from at least one premises within the macrogrid to determine at least one behavioral pattern according to usage behaviors for at least two appliances within one of said premises based on:
storing, in a database, power signal clips of model appliances that are comparable to the appliances;
creating, for each of the appliances, a model power draw based on a Hidden Markov Model (HMM);
estimating a Factorial HMM for the appliances using an Explicit Duration HMM with Difference Observations, the estimating based on the model power draws;
tuning one or more parameters of said Factorial HMM based on a comparison, of signal clips of power consumed at said one of said premises that include power signal clips of the appliances, with the power signal clips of the model appliances;
calculating a difference between a total power draw of the appliances at a first time and the total power draw of the appliances at a preceding time; and
determining whether a state of a maximum of one of the appliances has changed, based on said difference;
b) obtain data relating to the at least one behavioral pattern and a state of a user;
c) obtain data relating to at least one external impact on the user's power usage within the premises, said external impact originating from an environment of the user and not from the user;
d) use the obtained data from one or more of a) to c) to create an individual consumer forecast of power usage, said consumer forecast being collectively aggregated across a plurality of users;
e) use data from one or more of a) to d) to perform a demographic analysis;
f) collect macrogrid aggregate power consumption data for the region;
g) determine power consumption requirements across the macrogrid for the region using data from at least one of a) to e); and
h) determine future power requirements within the macrogrid, using the data obtained in at least one of a) to g).

13. The system of claim 12, wherein said external impacts are selected from any one of: weather patterns and predictions, calendar month, economic indicators, world events, television programming, equipment age and maintenance, and population mobility.

14. The system of claim 12 wherein the at least one behavioral pattern comprises data related to user behavioral states selected from one or more of the following states: sleeping, just awoken, on vacation, working from home, charging electric vehicles, and extended absence.

15. The system of claim 12 wherein the at least one behavioral pattern comprises data related to user behavioral patterns selected from one or more of the following patterns: sleeping hours, weekend schedules, weekday schedules, departure to work and arrival home from work, and amount of time spent away from home.

16. The system of claim 12 wherein a forecast period is selected as being one of: minutes, hours, days, months, seasonal and years.

17. The system of claim 12 further comprising instructions that cause the server to use the forecast to: regulate power supply and distribution, or identify timing and location of future upgrades.

18. The system of claim 12 further comprising instructions that cause the server to use the forecast to dynamically evaluate power consumption patterns in a selected demographic sector of the population.

19. The system of claim 12 further comprising instructions that cause the server to use the forecast to identify at least one demographic categorization with a higher predictability value than other demographic categorizations previously known.

20. The system of claim 12 further comprising instructions that cause the server to interpolate a sample user forecast onto larger populations with at least one diverse demographic variation.

21. The system of claim 12 further comprising instructions that cause the server to use the forecast to identify one or more periods in a user's billing cycle in which a potential for energy conservation is high for that user.

22. The system of claim 12 further comprising instructions that cause the server to use the forecast to identify a power consumption reduction and budget reduction plan.

23. A system for forecasting and predicting power usage within a macrogrid, the system comprising a server and one or more databases, the server comprising a processor and memory, the memory comprising computer executable instructions which, when executed by the processor cause the server to:
   a) periodically receive granular power consumption data from a statistically significant portion of a target population of power users within the macrogrid for a region;
   b) use the power consumption data to perform a consumer load disaggregation to determine usage behaviors for at least two appliances in a premises within the macrogrid based on:
      storing, in a database, power signal clips of model appliances that are comparable to the appliances;
      creating, for each of the appliances, a model power draw based on a Hidden Markov Model (HMM);
      estimating a Factorial HMM for the appliances using an Explicit Duration HMM with Difference Observations, the estimating based on the model power draws;
      tuning one or more parameters of said Factorial HMM based on a comparison, of signal clips of power consumed at the premises that include power signal clips of the appliances, with the power signal clips of the model appliances;
      calculating a difference between a total power draw of the appliances at a first time and the total power draw of the appliances at a preceding time; and
      determining whether a state of a maximum of one of the appliances has changed, based on said difference;
   c) obtain data relating to at least one behavioral pattern and a state of a user;
   d) obtain data relating to external impacts on the user's power usage within the premises, said external impacts originating from an environment of the user and not from the user;
   e) use obtained data from at least one of a) to d) to generate an individual consumer forecast of power usage, the consumer forecast being collectively aggregated across a plurality of users;
   f) use data from one or more of a) to e) to perform a demographic analysis;
   g) collect aggregate power consumption data for a region associated with the macrogrid;
   h) determine power consumption requirements across the macrogrid for the region using data from at least one of more of a) to g); and
   i) determine future power requirements within the macrogrid, using the data obtained in at least one of a) to h).

* * * * *